(12) United States Patent
Shin

(10) Patent No.: US 11,579,493 B2
(45) Date of Patent: Feb. 14, 2023

(54) EXPOSURE MASK AND DISPLAY DEVICE MANUFACTURED BY USING THE SAME

(71) Applicant: Samsung Display Co., Ltd., Yongin-si (KR)

(72) Inventor: Dong Hee Shin, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 324 days.

(21) Appl. No.: 16/795,425

(22) Filed: Feb. 19, 2020

(65) Prior Publication Data
US 2021/0018775 A1 Jan. 21, 2021

(30) Foreign Application Priority Data

Jul. 15, 2019 (KR) ........................ 10-2019-0085299

(51) Int. Cl.
| | | |
|---|---|---|
| *H01L 51/52* | (2006.01) | |
| *G02F 1/1339* | (2006.01) | |
| *H01L 27/12* | (2006.01) | |
| *G03F 1/58* | (2012.01) | |
| *G03F 1/42* | (2012.01) | |
| *G02F 1/1345* | (2006.01) | |
| *G02F 1/1368* | (2006.01) | |

(52) U.S. Cl.
CPC ........ *G02F 1/1339* (2013.01); *G02F 1/13394* (2013.01); *G02F 1/13454* (2013.01); *G03F 1/42* (2013.01); *G03F 1/58* (2013.01); *H01L 27/1244* (2013.01); *H01L 27/1288* (2013.01); *G02F 1/1368* (2013.01); *G02F 1/13396* (2021.01)

(58) Field of Classification Search
None
See application file for complete search history.

(56) References Cited

U.S. PATENT DOCUMENTS

| | | | |
|---|---|---|---|
| 6,292,249 B1 * | 9/2001 | Kane | G02F 1/13394 349/122 |
| 7,588,869 B2 | 9/2009 | Lee et al. | |
| 10,126,603 B2 | 11/2018 | Kim et al. | |
| 2005/0243261 A1 * | 11/2005 | Chiang | G02F 1/133514 349/155 |
| 2007/0103634 A1 * | 5/2007 | Kim | G02F 1/1339 349/154 |

(Continued)

FOREIGN PATENT DOCUMENTS

| | | |
|---|---|---|
| KR | 10-2004-0110381 A | 12/2004 |
| KR | 10-2006-0014317 A | 2/2006 |

(Continued)

*Primary Examiner* — Benjamin P Sandvik
(74) *Attorney, Agent, or Firm* — Lewis Roca Rothgerber Christie LLP

(57) ABSTRACT

A display device includes: a display area including a plurality of pixels; a first peripheral area disposed at one side of the display area; and a second peripheral area disposed at the opposite side of the display area, wherein a first column spacer is disposed in the display area, a second column spacer is disposed in the first peripheral area, and a third column spacer is disposed in the second peripheral area. The patterns of an exposure mask utilized in the first peripheral area in which the second column spacer is disposed and the second peripheral area in which the third column spacer is disposed may be different from each other.

10 Claims, 12 Drawing Sheets

(56) References Cited

U.S. PATENT DOCUMENTS

2013/0050619 A1* 2/2013 Kim .................... G02F 1/13394
    430/320
2017/0038636 A1* 2/2017 Yu ....................... G02F 1/13394

FOREIGN PATENT DOCUMENTS

| KR | 10-2007-0122082 A | 12/2007 |
| KR | 10-0935674 B1 | 1/2010 |
| KR | 10-2018-0027715 A | 3/2018 |

* cited by examiner

EXPOSURE MASK AND DISPLAY DEVICE MANUFACTURED BY USING THE SAME

CROSS-REFERENCE TO RELATED APPLICATION

This application claims priority to and the benefit of Korean Patent Application No. 10-2019-0085299 filed in the Korean Intellectual Property Office on Jul. 15, 2019, the entire content of which is incorporated herein by reference.

BACKGROUND

1. Field

One or more aspects of example embodiments of the present disclosure are related to an exposure mask and a display device manufactured by using the same.

2. Description of the Related Art

Liquid crystal displays (LCD), organic light emitting diode (OLED) displays), and the like are used as display devices.

A liquid crystal display includes two display panels on which field generating electrodes (such as pixel electrodes and common electrodes) are formed, and a liquid crystal layer filled therebetween. The liquid crystal display generates an electric field in the liquid crystal layer by applying a voltage to the field generating electrodes to determine or change a direction (e.g., alignment) of liquid crystal molecules in the liquid crystal layer, and to control polarization of incident light, thereby displaying an image.

Larger display devices are desired, but there is a limit to the size of a mask that can be used in an exposure apparatus during manufacturing of the display device. In order to solve this, a divided exposure method may be used, in which a large area substrate is exposed with a single mask several times during an exposure process.

The above information disclosed in this Background section is only for enhancement of understanding of the background of the disclosure, and therefore it may contain information that is not prior art known in this country to a person of ordinary skill in the art.

SUMMARY

One or more aspects of embodiments of the present disclosure are directed toward an exposure mask that may simplify a manufacturing process by reducing the number of mask shots in a divided exposure process.

One or more aspects of embodiments of the present disclosure are directed toward a display device that may improve display quality thereof and may prevent or reduce a short circuit between upper and lower electrodes by reducing a stitch defect occurring at a boundary between adjacent shots and improving performance of a sealant.

One or more example embodiments of the present disclosure provide a display device including: a display area including a plurality of pixels; a first peripheral area disposed at one side of the display area; and a second peripheral area disposed at the other side of the display area and spaced apart from the one side in one (a first) direction, wherein a first column spacer is disposed in the display area in a first pattern, a second column spacer is disposed in the first peripheral area in a second pattern, and a third column spacer is disposed in the second peripheral area in a third pattern, and in corresponding areas respectively disposed at the same point in the first peripheral area and the second peripheral area, a pattern in which the second column spacer is disposed and a pattern in which the third column spacer is disposed (e.g., the second pattern and the third pattern) are different from each other.

When the first peripheral area where the second column spacer is disposed and the second peripheral area where the third column spacer are disposed overlap in a plan view, a planar sum of the patterns in which the second and third column spacers are disposed (e.g., a planar sum of the second pattern and the third pattern where the first and second peripheral areas overlap) may be the same as a portion of a pattern in which the first column spacer is disposed on the display area having the same area as an area where the first and second peripheral areas overlap (e.g., with respect to a same unit area).

The first peripheral area may include a first driving area that is adjacent to the display area and in which a first gate driver is disposed, and a first sealing area that is adjacent to the first driving area and in which a portion of a sealant is disposed; the second peripheral area may include a second driving area that is adjacent to the display area and in which a second gate driver is disposed, and a second sealing area that is adjacent to the second driving area and in which another portion of the sealant is disposed; and the second column spacer may be disposed in the first driving area, and the third column spacer is disposed in the second driving area.

When the first peripheral area where the second column spacer is disposed and the second peripheral area where the third column spacer are disposed overlap in a plan view, the second column spacer and the third column spacer may be spaced apart from each other.

The first peripheral area may include a plurality of first peripheral transistors; the second peripheral area may include a plurality of second peripheral transistors; and when the first peripheral area where the second column spacer is disposed and the second peripheral area where the third column spacer are disposed overlap in a plan view, at least some of the first and second peripheral transistors may overlap each other.

A total number of the second column spacers disposed in the first driving area may be half of the number of the first column spacers disposed in the display area having the same area as the first driving area (e.g., with respect to the same unit area).

A total number of the third column spacers disposed in the second driving area may be half of the number of the first column spacers disposed in the display area having the same area as the second driving area (e.g., with respect to the same unit area).

The first driving area and the second driving area may have the same area; and a sum of a total density of the second column spacers disposed in the first driving area and a total density of the third column spacers disposed in the second driving area may be the same as a total density of the first column spacers disposed in the display area having the same area as the first driving area (e.g., with respect to the same unit area).

The first driving area may include a plurality of left driving unit areas; the second driving area may include a plurality of right driving unit areas; the display area may include a plurality of general display unit areas; all (each) of the left driving unit area, the right driving unit area, and the general display unit area may have the same unit (planar) area; the left driving unit area may include a first left driving unit area; the right driving unit area may include a first right driving unit area; and the second column spacer and the third column spacer may be spaced apart from each other when the first left driving unit area and the first right driving unit area overlap each other.

One general display unit area may overlap two or more of the plurality of pixels.

A first control signal line that applies a first control signal to the first gate driver may be disposed in the first sealing area; (the portion of) the sealant disposed in the first sealing area and the first control signal line may overlap each other; a second control signal line that applies a second control signal to the second gate driver may be disposed in the second sealing area; and (the another portion of) the sealant disposed in the second sealing area and the second control signal line may overlap each other.

One or more example embodiments of the present disclosure provide an exposure mask including: a non-overlapping portion including a first pattern; a left boundary portion disposed at one side of the non-overlapping portion and including a second pattern; and a right boundary portion disposed at the other side of the non-overlapping portion spaced apart from the one side in one direction and including a third pattern, wherein the second pattern may include a plurality of left units, and each of the plurality of left units may independently include a first white pattern and a first black pattern; the third pattern may include a plurality of right units, and each of the plurality of right units may independently include a second white pattern and a second black pattern; the second pattern may include a plurality of the first white patterns and the first black patterns disposed in an irregular shape (arrangement); the third pattern may include a plurality of the second white patterns and the second black patterns disposed in an irregular shape (arrangement); an area (planar area) of an opening area included in the first white pattern may be larger than a planar area of an opening area included in the first black pattern, and an area (planar area) of an opening area included in the second white pattern may be larger than a planar area of an opening area included in the second black pattern; and a planar sum of the second pattern and the third pattern may be the same as a portion of the first pattern.

The left unit may include a first left unit disposed at a first point, and the right unit may include a first right unit disposed at a second point; the first point and the second point may be respectively disposed at the same point with respect to the left boundary and the right boundary; each of the first white pattern and the second black pattern may include the opening area and the blocking area; and when the first left unit and the first right unit overlap, the opening area included in the second black pattern may overlap the blocking area included in the first white pattern.

Each of the first black pattern and the second white pattern may include the opening area and the blocking area; and when the first left unit and the first right unit overlap, the opening area included in the second white pattern may overlap the blocking area included in the first black pattern.

The exposure mask may include a first exposure mask used for a first shot, and a second exposure mask used for a second shot; the second point of the first exposure mask may overlap the first point of the second exposure mask; and the first exposure mask and the second exposure mask may be the same.

A total planar area of the opening area included in the second pattern may be half a total planar area of the opening area in the first pattern included in the non-overlapping portion having the same area as the left boundary portion (e.g., with respect to the same unit area).

A total planar area of the opening area included in the third pattern may be half of total planar area of the opening area of the first pattern included in the non-overlapping portion having the same area as the right boundary portion (e.g., with respect to the same unit area).

The left boundary and the right boundary may have the same area; and a sum of a total area of the opening area included in the second pattern and a total area of the opening area included in the third pattern may be the same as a total area of the opening area included in the first pattern of the non-overlapping portion having the same area as the left boundary portion (e.g., with respect to the same unit area).

The exposure mask may expose one substrate of a display device including a plurality of pixels; and each of the one left unit and the one right unit may have an area substantially equal to an area of two or more of the plurality of pixels.

One selected from the opening area and the blocking area included in each of the first pattern, the second pattern, and the third pattern may form a column spacer of the display device.

According to the embodiments, since the exposure mask includes the boundary portion having a gradual pattern at both sides thereof, it is possible to improve or remedy stitch defects and to simplify a manufacturing process of the display device.

In some embodiments, for example, it is possible to improve the display quality by preventing or reducing the step and the adhesion decrease of the sealant in the sealing area of the display device, and it is possible to prevent or reduce the short circuit between the electrodes of the upper and lower display panels in the driving area.

DETAILED DESCRIPTION

Figure 1:
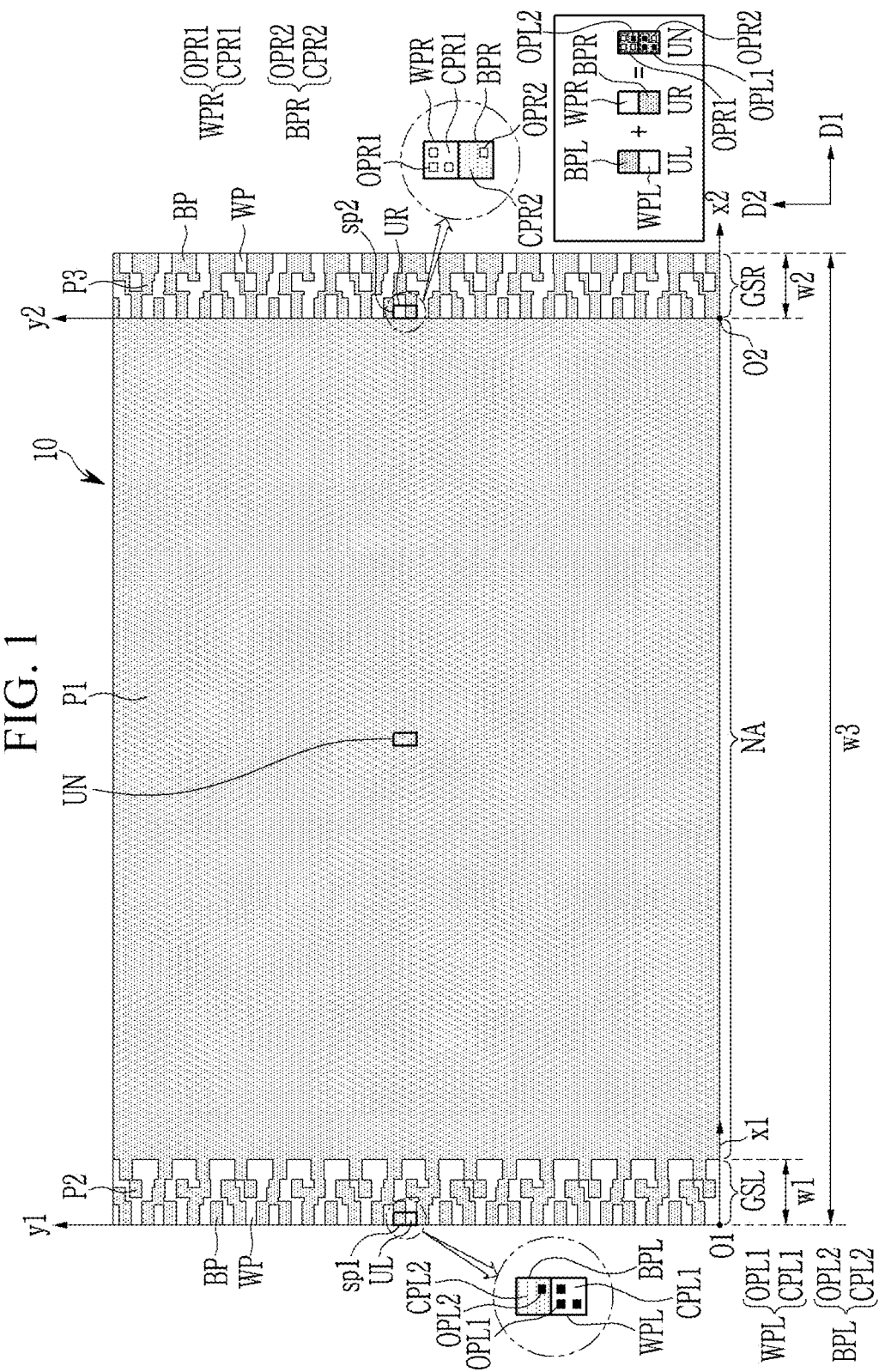
FIG. 1 illustrates a top plan view of an exposure mask according to an embodiment.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" indicates that the target portion is viewed from the top, and the phrase "in a cross-section" indicates a view of a cross-section that is formed by vertically cutting a target portion from the side.

Hereinafter, an exposure mask 10 according to an embodiment will be described with reference to FIG. 1. FIG. 1 illustrates a top plan view of an exposure mask 10 according to an embodiment.

The exposure mask 10 according to the embodiment is for manufacturing a display device, and includes a pattern to be exposed (e.g., to be formed by exposure) on a substrate of the display device. The pattern may be a photoresist pattern, a color filter pattern, a black matrix pattern, or a column spacer (CS) pattern (see FIG. 6). Hereinafter, the exposure mask 10 according to the embodiment, which is a mask for the column spacer (CS) (see FIG. 6) as an example, will be described.

Referring to FIG. 1, the exposure mask 10 according to the embodiment includes a non-overlapping portion NA, and a left boundary portion GSL and a right boundary portion GSR disposed at respective sides of the non-overlapping portion NA.

A first pattern P1 (for example, an alternating pattern of opening area(s) and blocking area(s)) is formed in the non-overlapping portion NA. The first pattern P1 may be a pattern to form a first column spacer CS1 (see FIG. 6) disposed in a display area DA (see FIG. 6).

The left boundary portion GSL is disposed at one (e.g., a first or left) side of the non-overlapping portion NA, and the right boundary portion GSR is disposed at another (e.g., second or right) side of the non-overlapping portion NA that is spaced apart from the one side of the non-overlapping portion NA (e.g., opposite the first side) in a first direction D1. The left boundary portion GSL and the right boundary portion GSR may respectively extend along opposite sides of the non-overlapping portion NA in a second direction D2.

The left boundary portion GSL includes a second pattern P2. The second pattern P2 is the same kind of pattern as the first pattern P1 (e.g., has similar characteristics and/or function), but has a different shape or arrangement when compared with the first pattern P1. The second pattern P2 may be a pattern to form a second column spacer CS2 (see FIG. 6) disposed in a first driving area DA (see FIG. 6).

The second pattern P2 includes a plurality of black patterns BP and white patterns WP disposed in an irregular shape. The black pattern BP and the white pattern WP are shown to have various shapes and areas. The black pattern BP and the white pattern WP may include opening areas OPL1 and OPL2 and blocking areas CPL1 and CPL2, respectively. A total area of the opening area OPL1 of the white pattern WP may be larger than that of the opening area OPL2 of the black pattern BP.

A ratio of the opening areas OPL1 of the white pattern WP to the opening areas OPL2 of the black pattern BP may vary. For example, the opening areas OPL1 and OPL2 and the blocking areas CPL1 and CPL2 of the second pattern P2 may be irregularly disposed in the left boundary portion GSL. As used herein, the terms "disposed in an irregular shape", "irregularly disposed", and "irregularly arranged" may indicate that the opening areas OPL1 and OPL2 and the blocking areas CPL1 and CPL2 are not positioned in a regular repeating grid, lattice, or pattern, etc. For example, the opening area OPL1 may be positioned within the blocking area CPL1 in a first position, and the opening area OPL2 may be positioned within the blocking area CPL2 in a second position, where the first and second positions appear in different locations when CPL1 and CPL2 are superimposed. Furthermore, the opening areas OPL1 and OPL2 may each independently include one or more sub-openings, and the number of sub-openings in each may be different. In some embodiments, the positions of the sub-openings within CPL1 and CPL2 may be completely different (e.g., may not overlap) when CPL1 and CPL2 are superimposed.

A total area of the opening areas (e.g., OPL1 and OPL2) included in the second pattern P2 in the left boundary portion GSL may be half of that of the opening areas included in the first pattern P1 of the non-overlapping area NA when portions having the same total area (e.g., a same unit area) are compared.

As described above, the second pattern P2 in which the opening areas OPL1 and OPL2 and the blocking areas CPL1 and CPL2 are irregularly disposed may be referred to as a gradual pattern or a mosaic pattern.

When exposed using the exposure mask 10, the column spacer CS (see FIG. 6) may be formed in an area corresponding to the opening areas OPL1 and OPL2 or the blocking areas CPL1 and CPL2 by positive or negative exposure.

The left boundary portion GSL may include a plurality of left units UL having the same area. A set or predetermined area of the left boundary portion GSL is referred to as a left unit UL, and a single left unit UL is shown for convenience of description. Hereinafter, an area of the left unit UL is called a unit area. The unit area may be variously set.

An example left unit UL is shown enlarged at the left side of FIG. 1. Each of the plurality of left units UL may separately and independently include a first black pattern BPL and a first white pattern WPL. The first black pattern BPL and the first white pattern WPL may include opening areas OPL1 and OPL2 and blocking areas CPL1 and CPL2, respectively. An area (e.g., total area) of the opening area OPL1 of the first white pattern WPL may be larger than that of the opening area OPL2 of the first black pattern BPL.

The left boundary portion GSL has a first width w1 in the first direction D1. The first width w1 may be about 2 mm or more to about 5 mm or less, but is not limited thereto. For example, the first width w1 may be about 3 mm, about 4.4 mm, or about 4.75 mm.

The right boundary portion GSR includes a third pattern P3. The third pattern P3 is the same kind of pattern as the first pattern P1, but has a different shape or arrangement when compared with the first pattern P1. The third pattern P3 may be a pattern to form a third column spacer CS3 (see FIG. 6) disposed in a second driving area GA2 (see FIG. 6). The third pattern P3 may be the same kind of pattern as the second pattern P2, but has a different shape or arrangement when compared with the second pattern P2.

Similar to the second pattern P2, the third pattern P3 also includes a plurality of black patterns BP and white patterns WP that are irregularly arranged. The black pattern BP and the white pattern WP included in the third pattern P3 have opening areas OPR1 and OPR2 and blocking areas CPR1 and CPR2, respectively, and a total area of the opening area OPR1 of the white pattern WP may be larger than that of the opening area OPR2 of the black pattern BP.

A ratio of the opening area OPR1 of the white pattern WP to the opening area OPR2 of the black pattern BP may vary. In some embodiments, for example, the opening areas OPR1 and OPR2 and the blocking areas CPR1 and CPR2 of the third pattern P3 may be irregularly disposed in the right boundary portion GSR. As used herein, the terms "irregularly arranged" and "irregularly disposed" may indicate that the opening areas OPR1 and OPR2 and the blocking areas CPR1 and CPR2 are not positioned in a regular repeating grid, lattice, or pattern, etc. For example, the opening area OPR1 may be positioned within the blocking area CPR1 in a first position, and the opening area OPR2 may be positioned within the blocking area CPR2 in a second position, where the first and second positions appear in different locations when CPR1 and CPR2 are superimposed. Furthermore, the opening areas OPR1 and OPR2 may each independently include one or more sub-openings, and the number of sub-openings in each may be different. In some embodiments, the positions of the sub-openings within CPR1 and CPR 2 may be completely different (e.g., may not overlap) when CPR1 and CPR2 are superimposed.

A total area of the opening areas (e.g., OPR1 and OPR2) included in the third pattern P3 in the right boundary portion GSR may be half of that of the opening areas included in the first pattern P1 of the non-overlapping area NA when portions having the same total area (e.g., unit area) are compared.

As described above, the third pattern P3 in which the opening areas OPR1 and OPR2 and the blocking areas CPR1 and CPR2 are irregularly disposed may be referred to as a gradual pattern or a mosaic pattern.

The right boundary portion GSR may include a plurality of right units UR having the same area. A set or predetermined area of the right boundary portion GSR is referred to as a right unit UR, and a single right unit UR is shown for convenience of description. As described above, the right unit UR has a unit area corresponding to the same area as the left unit UL (e.g., a same unit area).

An example right unit UR is shown enlarged at the right side of FIG. 1. Each of the plurality of right units UR may separately and independently include a second black pattern BPR and a second white pattern WPR. The second black pattern BPR and the second white pattern WPR may include opening areas OPR1 and OPR2 and blocking areas CPR1 and CPR2, respectively. An area of the opening area OPR1 of the second white pattern WPR may be larger than that of the opening area OPR2 of the second black pattern BPR.

The right boundary portion GSR has a second width w2 in the first direction D1. The second width w2 may be about 2 mm to about 5 mm, but is not limited thereto. For example, the second width w2 may be about 3 mm, about 4.4 mm, or about 4.75 mm.

The total areas of the left boundary portion GSL and the right boundary portion GSR may be the same. The first width w1 and the second width w2 may be the same. A length of the left boundary portion GSL in the second direction D2 and a length of the right boundary portion GSR in the second direction D2 may also be the same.

A sum of the total area of the opening area included in the second pattern P2 and the total area of the opening area included in the third pattern P3 may be the same as the total area of the opening area included in the first pattern P1 of the non-overlapping portion NA when portions having the same total area (e.g., unit area) are compared (e.g., with respect to the same unit area).

When the left boundary portion GSL and the right boundary portion GSR are moved side by side in the first direction D1 (e.g., so that the right boundary portion GSR of a first exposure mask overlaps with the left boundary portion GSL of a second exposure mask position) so that successive or adjacent exposure masks overlap each other in a plan view, the opening areas OPR1 and OPR2 of the third pattern P3 may overlap the blocking areas CPL1 and CPL2 of the second pattern P2. The opening areas OPL1 and OPL2 of the second pattern P2 may overlap the blocking areas CPR1 and CPR2 of the third pattern P3.

A planar sum of the second pattern P2 and the third pattern P3 may be the same as the first pattern P1 included in the non-overlapping portion NA when portions having the same total area (e.g., unit area) are compared (e.g., with respect to the same unit area).

A full width of the exposure mask 10 in the first direction D1 according to the embodiment is referred to as a third width w3. The third width w3 may be about 500 mm to about 1500 mm. For example, the third width w3 may be about 700 mm to about 1200 mm. The third width w3 will be described in more detail with reference to FIG. 2.

Hereinafter, the left unit UL and the right unit UR included in respective boundary portions GSL and GSR will be described. The left unit UL and the right unit UR not only have the same area (unit area), but also have the same polygonal shape. For example, the left unit UL and the right unit UR may each have a quadrangular shape, or square shape, but the shapes of the left unit UL and the right unit UR are not limited thereto.

The left unit UL and the right unit UR shown in FIG. 1 are disposed at the same point with respect to the boundary portions GSL and GSR, respectively.

For example, the left boundary portion GSL and the right boundary portion GSR may each have a rectangular shape including pairs of sides parallel to the first direction D1 and the second direction D2, respectively. In this case, vertices at lower left ends of the left boundary portion GSL and the right boundary portion GSR are referred to as a first origin point O1 and a second origin point O2, respectively. A coordinate including an x1 axis and a y1 axis that are perpendicular (normal) to each other at the first origin point O1 is called a first coordinate, and a coordinate including an x2 axis and a y2 axis that are perpendicular (normal) to each other at the second origin point O2 is called a second coordinate.

The left unit UL shown in FIG. 1 is disposed at a first point sp1, and the right unit UR shown in FIG. 1 is disposed at a second point sp2. For example, the first point sp1 and the second point sp2 may each have (e.g., be the center of) four coordinates corresponding to the corners of a rectangle. The coordinates of the first point sp1 on the first coordinate and the coordinates of the second point sp2 on the second coordinate may be the same. For example, the left unit UL and the right unit UR shown in FIG. 1 are respectively disposed at the same point with respect to the first coordinate and the second coordinate (e.g., in their respective coordinate reference frames).

When the left boundary portion GSL and the right boundary portion GSR are overlapped in a plan view so that the first origin point O1 and the second origin point O2 coincide with each other, the left unit UL and the right unit UR shown in FIG. 1 may completely overlap each other.

The general unit UN is a unit that is disposed on the non-overlapping portion NA, and has the same shape and area as the left unit UL and the right unit UR.

Hereinafter, a relationship between the left unit UL and the right unit UR shown in FIG. 1 will be described with reference to the inset box at a lower right end of FIG. 1.

The left unit UL may include the first white pattern WPL and the first black pattern BPL described above. The first white pattern WPL may include the opening area OPL1 and the blocking area CPL1, and the first black pattern BPL may include the opening area OPL2 and the blocking area CPL2, wherein the total area of the opening area OPL1 of first white pattern WPL may be larger than that of the opening area OPL2 of the first black pattern BPL.

The right unit UR may include the second white pattern WPR and the second black pattern BPR. The second white pattern WPR may include the opening area OPR1 and the blocking area CPR1, and the second black pattern BPR may include the opening area OPR2 and the blocking area CPR2. The total area of the opening area OPR1 of the second white pattern WPR may be larger than that of the opening area OPR2 of the second black pattern BPR.

When the left unit UL and the right unit UR shown in FIG. 1 are overlapped, the first white pattern WPL and the second black pattern BPR may be overlapped, and the first black pattern BPL and the second white pattern WPR may be overlapped. The first white pattern WPL and the second black pattern BPR may be respectively disposed at the same point with respect to the first point sp1 and the second point sp2. Similarly, the first black pattern BPL and the second white pattern WPR may be respectively disposed at the same point with respect to the first point sp1 and the second point sp2 described above.

In this case, the opening area OPR1 included in the second white pattern WPR may overlap the blocking area CPL2 included in the first black pattern BPL, and the opening area OPR2 included in the second black pattern BPR may overlap the blocking area CPL1 included in the first white pattern WPL. In addition, the opening area OPL1 included in the first white pattern WPL may overlap the blocking area CPR2 included in the second black pattern BPR, and the opening area OPL2 included in the first black pattern BPL may overlap the blocking area CPR1 included in the second white pattern WPR.

The pattern in which the left unit UL and the right unit UR shown in FIG. 1, when overlapped, may be the same as the pattern of the general unit UN.

Figure 2:
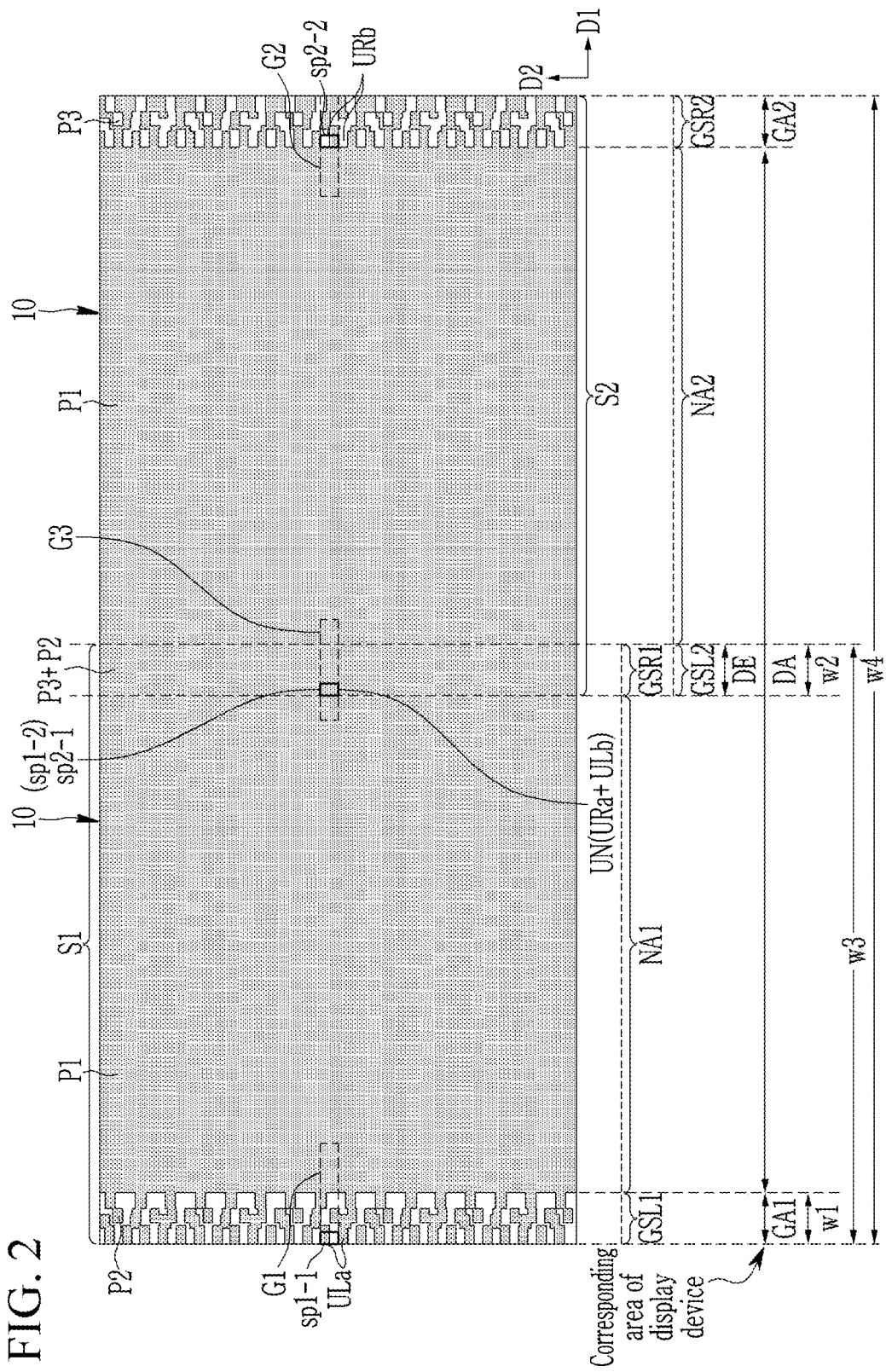
FIG. 2 illustrates a layout view of shots (e.g., exposure shots) performed on a substrate using the exposure mask of FIG. 1.

Hereinafter, an exposure process of performing a shot by using the exposure mask 10 according to an embodiment will be described with reference to FIG. 2. FIG. 2 illustrates a layout view of shots (e.g., two successive shots) performed in a display device using the exposure mask 10 of FIG. 1. Performing one exposure on an object to be exposed (for example, a substrate) with the exposure mask 10 is referred to herein as "one shot". Hereinafter, descriptions of the same or similar components and contents as those described with reference to FIG. 1 will not be provided again.

Referring to FIG. 2, the process and/or results of a first shot S1 and a second shot S2, each using the exposure mask 10 according to an embodiment, are illustrated. The exposure mask 10 used for the first shot S1 is referred to as a first exposure mask, and the exposure mask 10 used for the second shot S2 is referred to as a second exposure mask. In this case, the first exposure mask and the second exposure mask may be the same (e.g., reused and repositioned) exposure mask.

After the exposure mask 10 is disposed on a substrate, the first shot S1 is performed. In this case, respective portions of the exposure mask 10 exposed through the first shot S1 are referred to as a first left boundary portion GSL1, a first non-overlapping portion NA1, and a first right boundary portion GSR1. The first left boundary portion GSL1 is exposed such that the second pattern P2 on the substrate is exposed, the first non-overlapping portion NA1 is exposed such that the first pattern P1 on the substrate is exposed, and the first right boundary portion GSR1 is exposed such that the third pattern P3 on the substrate is exposed.

An a-th left unit ULa is illustrated on the first left boundary portion GSL1, and the a-th left unit ULa may correspond to the left unit UL (see FIG. 1) of the first shot S1. The a-th left unit ULa may be disposed at a first point sp1-1 of the first shot S1.

Next, the exposure mask 10 is moved with respect to the substrate by a set or predetermined distance in the first direction D1 (and/or the second mask S2 is applied to the substrate). An area adjacent to the first shot S1 is exposed through the second shot S2. In this case, respective portions of the exposure mask 10 exposed through the second shot S2 are referred to as a second left boundary portion GSL2, a second non-overlapping portion NA2, and a second right boundary portion GSR2.

A b-th right unit URb is illustrated on the second right boundary portion GSR2, and the b-th right unit URb may correspond to the right unit UR (see FIG. 1) of the second shot S2. The b-th right unit URb m ay be disposed at a second point sp2-2 of the second shot S2.

The a-th left unit ULa and the b-th right unit URb may be respectively disposed at the same point with respect to the first left boundary portion GSL1 and the second right boundary portion GSR2. Each of the first point sp1-1 of the first shot S1 and the second point sp2-2 of the second shot S2 may be the same as each of the first point sp1 and the second point sp2 described above with reference to FIG. 1.

In this case, since the same exposure mask 10 is used in the first shot S1 and the second shot S2, the first left boundary portion GSL1 and the second left boundary portion GSL2 have the same pattern of the second pattern P2, and the first right boundary portion GSR1 and the second right boundary portion GSR2 have the same pattern of the third pattern P3.

Accordingly, the second left boundary portion GSL2 is exposed so that the second pattern P2 is exposed on the substrate, the second non-overlapping portion NA2 is exposed so that the first pattern P1 is exposed on the substrate, and the second right boundary portion GSR2 is exposed so that the third pattern P3 is exposed on the substrate.

In the exposure process using the exposure mask 10 according to the embodiment, the second left boundary portion GSL2 completely overlaps the first right boundary portion GSR1. Since the substrate is double-exposed (e.g., subjected to two mask exposures) in the overlapping area, it is hereinafter referred to as a double exposure area DE. In the double exposure area DE, the first right boundary portion GSR1 is first exposed, and then the second left boundary portion GSL2 is exposed.

In the double exposure area DE, one general unit UN is shown (highlighted) at an arbitrary position. The general unit UN is a unit in which the a-th right unit URa and the b-th left unit ULb overlap each other (e.g., is a unit formed by the overlapping combination of an exposure of the a-th right unit URa and an exposure of the b-th left unit ULb). The a-th right unit URa may be disposed at the second point sp2-1 of the first shot S1, and the a-th left unit ULa may be disposed at the first point sp1-2 of the second shot S2.

Here, the a-th left unit ULa and the a-th right unit URa are respectively disposed at the same point (sp1-1 and sp2-1, respectively) with respect to the first left boundary portion GSL1 and the first right boundary portion GSR1, and the b-th left unit ULb is disposed at the same point (sp1-2 and sp2-2, respectively) as the a-th right unit URa. Therefore, the second point sp2-1 of the first shot S1 may overlap the first point sp1-2 of the second shot S2.

Hereinafter, areas of the display device corresponding to respective portions of the exposure mask 10 according to the embodiment will be described.

Figure 6:
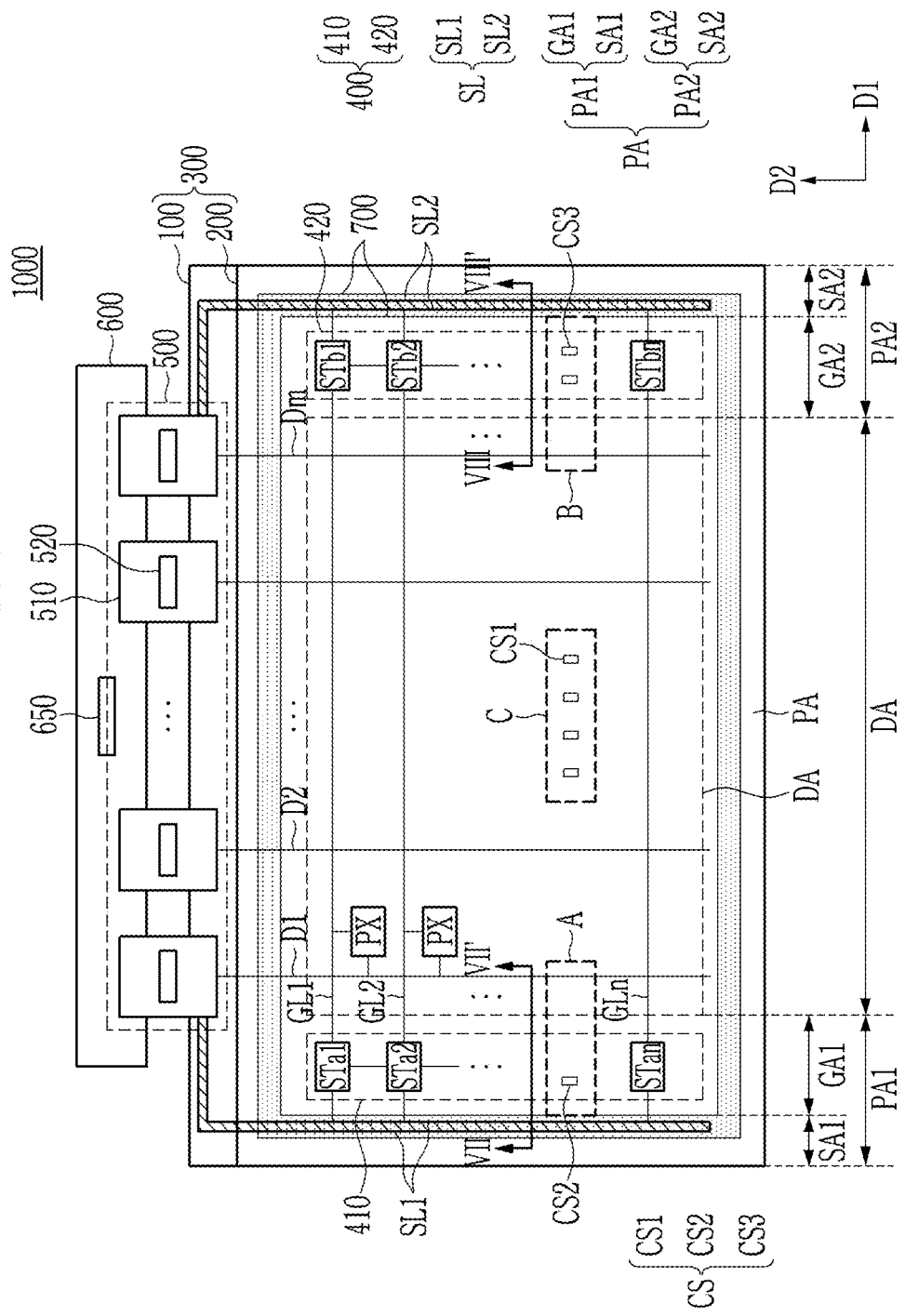
FIG. 6 illustrates a schematic top plan view of a display device according to an embodiment.

The first left boundary portion GSL1 may correspond to a first driving area GA1 (see FIG. 6) of the display device, and the second right boundary portion GSR2 may correspond to a second driving area GA2 (see FIG. 6). The first non-overlapping portion NA1, the double exposure area DE, and the second non-overlapping portion NA2 may correspond to the display area DA (see FIG. 6) of the display device. The first right boundary portion GSR1 and the second left boundary portion GSL2 are sequentially exposed on the substrate within the double exposure area DE, so that a pattern identical to a sum of the first non-overlapping portion NA1 and the second non-overlapping portion NA2 in a plan view is formed.

The double exposure area DE has a width in a plan view substantially equal to the first width w1 or the second width w2 in the first direction D1. As described above, the first width w1 or the second width w2 are substantially equal to each other.

A full width of the exposure mask 10 in the first direction D1 according to the embodiment is substantially equal to the third width w3. A full width of the display device manufactured by the exposure mask 10 in the first direction D1 is referred to as a fourth width w4. A relationship between the first width w1 (or the second width w2), the third width w3, and the fourth width w4 may be represented by Equation 1:

$$w4=2\times w3-w1 \text{ (or } w4=2\times w3-w2)$$ [Equation 1]

The fourth width w4 may be about 60 inches to about 90 inches, but is not limited thereto. For example, the fourth width w4 may be about 65 inches, about 75 inches, about 82 inches, or about 85 inches. Since 1 inch is substantially equal to about 25.4 mm, the fourth width w4 may equivalently be about 1500 mm to about 2500 mm, but is not limited thereto.

Equation 1 may be modified to the following Equation 2.

$$w3=(w4+w1)/2$$ [Equation 2]

As described above, since the first width w1 may be about 2 mm to about 5 mm and the fourth width w4 may be about 60 inches to about 90 inches (for example, about 1524 mm to about 2286 mm), the third width w3 may be about 500 mm to about 1500 mm. For example, the third width w3 may be about 700 mm to about 1200 mm.

When the exposure mask 10 according to the embodiment is utilized, the number of shots of the mask may be reduced since opposite edges of the exposure mask 10, for example, the outermost portions of the exposure mask 10, include a gradual area.

For example, when the outermost side of the exposure mask 10 is not the gradual area (e.g., when the exposure mask 10 does not include the gradual areas), two shots corresponding to opposite sides of the non-gradual area may be additionally needed or desired, and thus at least four shots may be required. In contrast, the exposure mask 10 according to the embodiment may be minimized or reduced to two shots since the outermost portions of opposite sides include the gradual area. For example, when the fourth width w4 is about 65 inches, the number of shots may be reduced from 5 shots to 2 shots, and when the fourth width w4 is about 75 inches or about 82 inches, the number of shots may be reduced from 6 shots to 3 shots.

A division exposure method that exposes a large area substrate through a plurality of shots using one exposure mask 10 in an exposure process has been used to manufacture large display devices. This process is prone to stitch defect problems, which occur where a stitch line is viewed due to a difference in exposure amount, mask alignment, or the like, between boundaries of adjacent shots.

Therefore, by forming the boundary portions GSL and GSR having a gradual pattern at opposite sides of the exposure mask 10 according to an embodiment, display quality may be improved by reducing the stitch defect occurring at the boundary between adjacent shots.

By forming a gradual area at opposite edges of the exposure mask 10, for example, at the outermost portions of the exposure mask 10, the process may be simplified by minimizing or reducing the number of mask shots.

A first group G1 including the a-th left unit ULa is set at the first shot S1, and a second group G2 including the b-th right unit URb is set at the second shot S2. In the vicinity of the double exposure area DE, a third group G3 including the general unit UN is set. The first group G1, the second group G2, and the third group G3 will be described later with reference to FIG. 3, FIG. 4, and FIG. 5.

Figure 3:
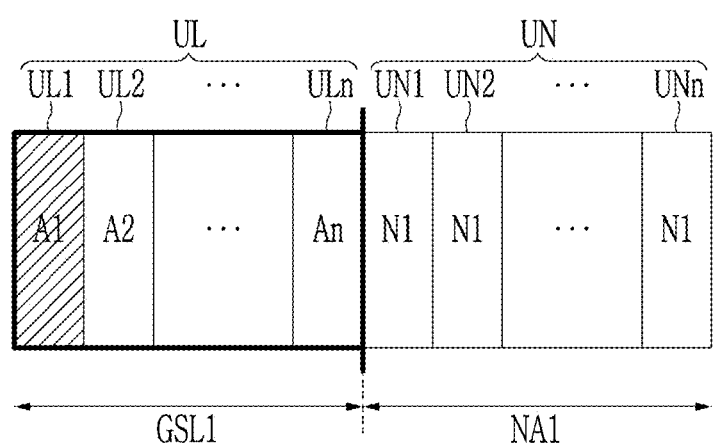
FIG. 3 is a top plan view for explaining a pattern formed in a first group of FIG. 2.
Figure 4:
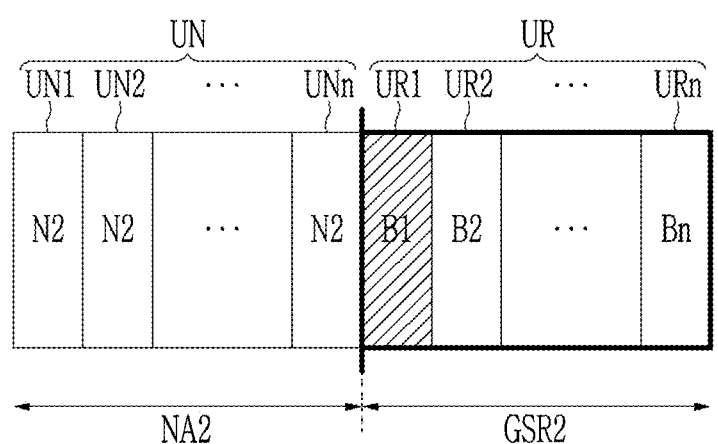
FIG. 4 is a top plan view for explaining a pattern formed in a second group of FIG. 2.
Figure 5:
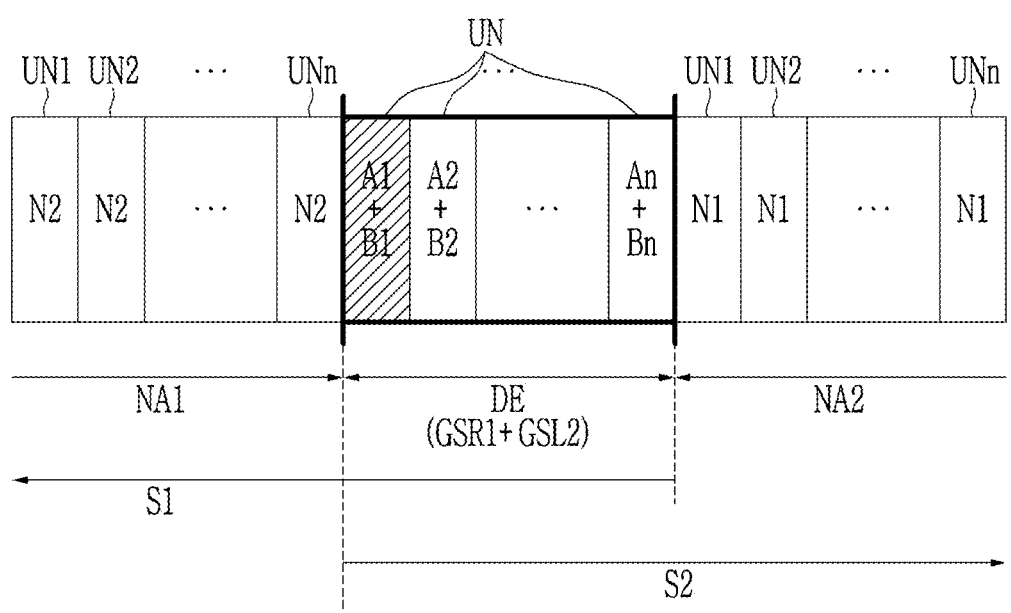
FIG. 5 is a top plan view for explaining a pattern formed in a third group of FIG. 2.

Hereinafter, the exposure mask 10 according to the embodiment will be described in more detail with reference to FIG. 3 to FIG. 5 in addition to FIG. 2. FIG. 3 is a top plan view for explaining a pattern formed in the first group G1 of FIG. 2, FIG. 4 is a top plan view for explaining a pattern formed in the second group G2 of FIG. 2, and FIG. 5 is a top plan view for explaining a pattern formed in the third group G3 of FIG. 2. Hereinafter, descriptions of the same or similar components and contents as those described with reference to FIG. 1 and FIG. 2 will not be provided again.

Referring first to FIG. 3 together with FIG. 2, the first group G1 includes a portion of the first left boundary portion GSL1 and a portion of the first non-overlapping portion NA1 adjacent thereto.

The first left boundary portion GSL1 of the first group G1 may include n left units (UL1, UL2, . . . , and ULn; hereinafter generically or collectively referred to as UL) including the first left unit UL1, and an n-th left unit is referred to as an n-th left unit ULn (where n is a positive integer). In FIG. 2, the a-th left unit ULa described above where a=1 corresponds to the first left unit UL1 of FIG. 3, and is indicated by hatched lines.

An "An pattern" is formed in the n-th left unit ULn. For example, an A1 pattern is formed in the first left unit UL1. The A1 pattern may include the first white pattern WPL (see FIG. 1) and the first black pattern BPL (see FIG. 1) described above with reference to FIG. 1. The An pattern may include (e.g., consist of) the first white pattern (WPL) and the first black pattern BPL that include the opening areas OPL1 and OPL2 (see FIG. 1) and the blocking areas CPL1 and CPL2 (see FIG. 1) having various areas. For example, the areas and positions of the opening areas OPL1 and OPL2 and the blocking areas CPL1 and CPL2 included in respective left units UL may vary.

The first non-overlapping NA1 of the first group G1 may include n general units (UN1, UN2, . . . , and UNn; hereinafter generically or collectively referred to as UN) including the first general unit UN1.

Each general unit UN is formed with an N1 pattern. The areas of the opening areas included in the N1 pattern may be the same in respective general units UN. The area of the opening area of the N1 pattern is different from the area of the opening area of the An pattern, and for example, the area of the opening area of the N1 pattern may be larger than the area of the opening area of the An pattern.

Referring to FIG. 4 together with FIG. 2, the second group G2 includes a portion of the second right boundary portion GSR2 and a portion of the second non-overlapping portion NA2 adjacent thereto.

The second right boundary portion GSR2 of the second group G2 may include n right units (UR1, UR2, . . . , and URn; hereinafter generically or collectively referred to as UR) including the first right unit UR1, and the n-th right unit is called an n-th right unit URn. In FIG. 2, the b-th right unit ULb described above where b=1 corresponds to the first right unit UR1 of FIG. 4, and is indicated by hatched lines.

The n-th left unit ULn and the n-th right unit URn are respectively disposed at the same point with respect to the first left boundary portion GSL1 and the second right boundary portion GSR2.

A Bn pattern is formed in the n-th right unit URn. For example, a B1 pattern is formed in the first right unit UR1. The B1 pattern may include the second white pattern WPR (see FIG. 1) and the second black pattern BPR (see FIG. 1) described above with reference to FIG. 1. The Bn pattern may include (e.g., consist of) the second white pattern (WPR) and the second black pattern BPR that include the opening areas OPR1 and OPR2 (see FIG. 1) and the blocking areas CPR1 and CPR2 (see FIG. 1) having various areas. For example, the areas and positions of the opening areas OPR1 and OPR2 and the blocking areas CPR1 and CPR2 included in respective right units UR may vary.

When the An pattern and the Bn pattern are overlapped, the opening area of the Bn pattern may be disposed in the blocking area of the An pattern. The opening area of the An pattern may be disposed in the blocking area of the Bn pattern. For example, the Bn pattern may be patterned on a portion that is not patterned through the An pattern on the substrate. Accordingly, the areas of the opening areas respectively included in the An pattern and the Bn pattern at the same point may be different from each other. However, the total areas of the opening areas respectively included in the An pattern and the Bn pattern may be the same. In addition, the total areas of the blocking areas respectively included in the An pattern and the Bn pattern may be the same.

The second non-overlapping NA2 of the second group G2 may also include n general units (UN1, UN2, . . . , and UNn; hereinafter generically or collectively referred to as UN) including the first general unit UN1. The general unit UN of the second group G2 is a different (e.g., spatially independent) unit from the general unit UN of the first group G1 described above in their positions, but will be described with the same terms for convenience of description.

Although it will be described that the N2 pattern is included in respective general units UN of the second group G2, the N2 pattern may be the same pattern as the N1 pattern described above. For example, the areas of the opening areas of the N2 pattern may be the same as in respective general units UN. The area of the opening area of the N2 pattern is different from the area of the opening area of the Bn pattern, and In some embodiments, the area of the opening area of the N2 pattern may be larger than the area of the opening area of the Bn pattern.

Next, referring to FIG. 5 together with FIG. 2 to FIG. 4, the third group G3 includes a portion of the first shot S1 and a portion of the second shot S2 adjacent thereto. The portion of the first shot S1 included in the third group G3 includes a portion of the first non-overlapping portion NA1 and a portion of the first right boundary portion GSR1. The portion of the second shot S2 included in the third group G3 includes a portion of the second left boundary portion GSL2 and a portion of the second non-overlapping portion NA2. In this case, a portion where the first right boundary portion GSR1 and the second left boundary portion GSL2 overlap is referred to as the double exposure area DE.

Since the first right boundary portion GSR1 includes the same pattern as the second right boundary portion GSR2, the first shot S1 of the third group G3 may include the same pattern as the second group G2 of FIG. 4. For example, in the third group G3, the N2 pattern (which is the same as the N1 pattern) of the first non-overlapping portion NA1 is exposed through the first shot S1, and the B1, B2, . . . , and Bn patterns of the first right boundary portion GSR1 are exposed.

Since the second left boundary portion GSL2 includes the same pattern as the first left boundary portion GSL1, the second shot S3 of the third group G3 may include the same pattern as the first group G1 of FIG. 3. For example, in the third group G3, the patterns A1, A2, . . . , and An of the second left boundary portion GSL2 are exposed through the second shot S2, and the N1 pattern (which is the same as the N2 pattern) of the second non-overlapping portion NA2 is exposed.

The double exposure area DE may include n general units UN, like the non-overlapping portions NA1 and NA2. In respective general units UN, An+Bn patterns in which the B1, B2, . . . , and Bn patterns and the A1, A2, . . . , and An patterns are respectively combined are exposed. The areas of opening areas of the An+Bn patterns may be substantially equal to those of the N1 patterns or the N2 patterns.

In summary, the pattern in which the first left boundary portion GSL1 and the second right boundary portion GSR2 overlap may be the same as the pattern of the double exposure area DE. In some embodiments, a planar sum of the patterns of the two boundary portions GSL1 and GSR2 may be the same as the pattern of the non-overlapping portions NA1 and NA2 when the same unit areas are compared.

Figure 7:
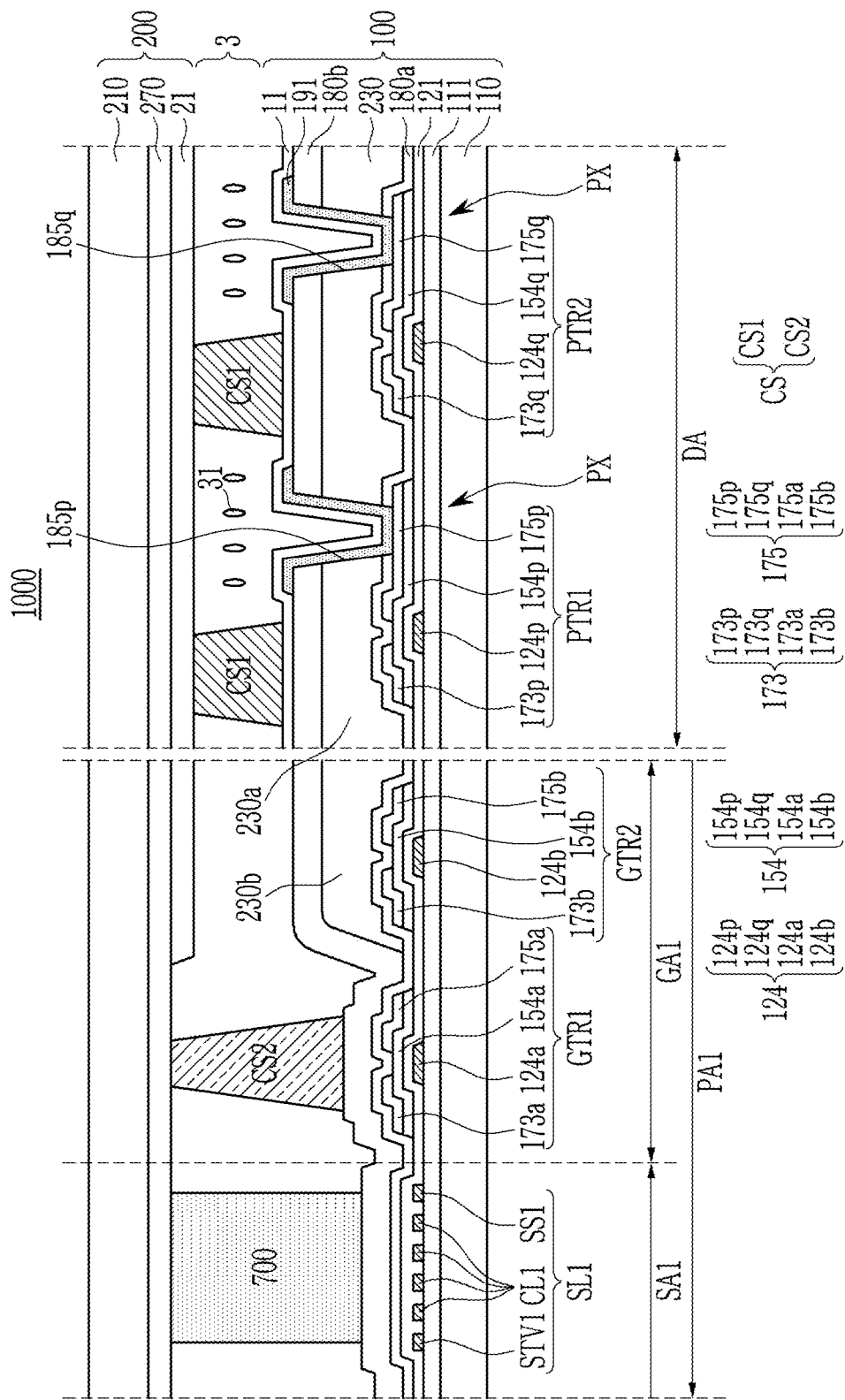
FIG. 7 illustrates a cross-sectional view taken along line VII-VII' of FIG. 6.
Figure 8:
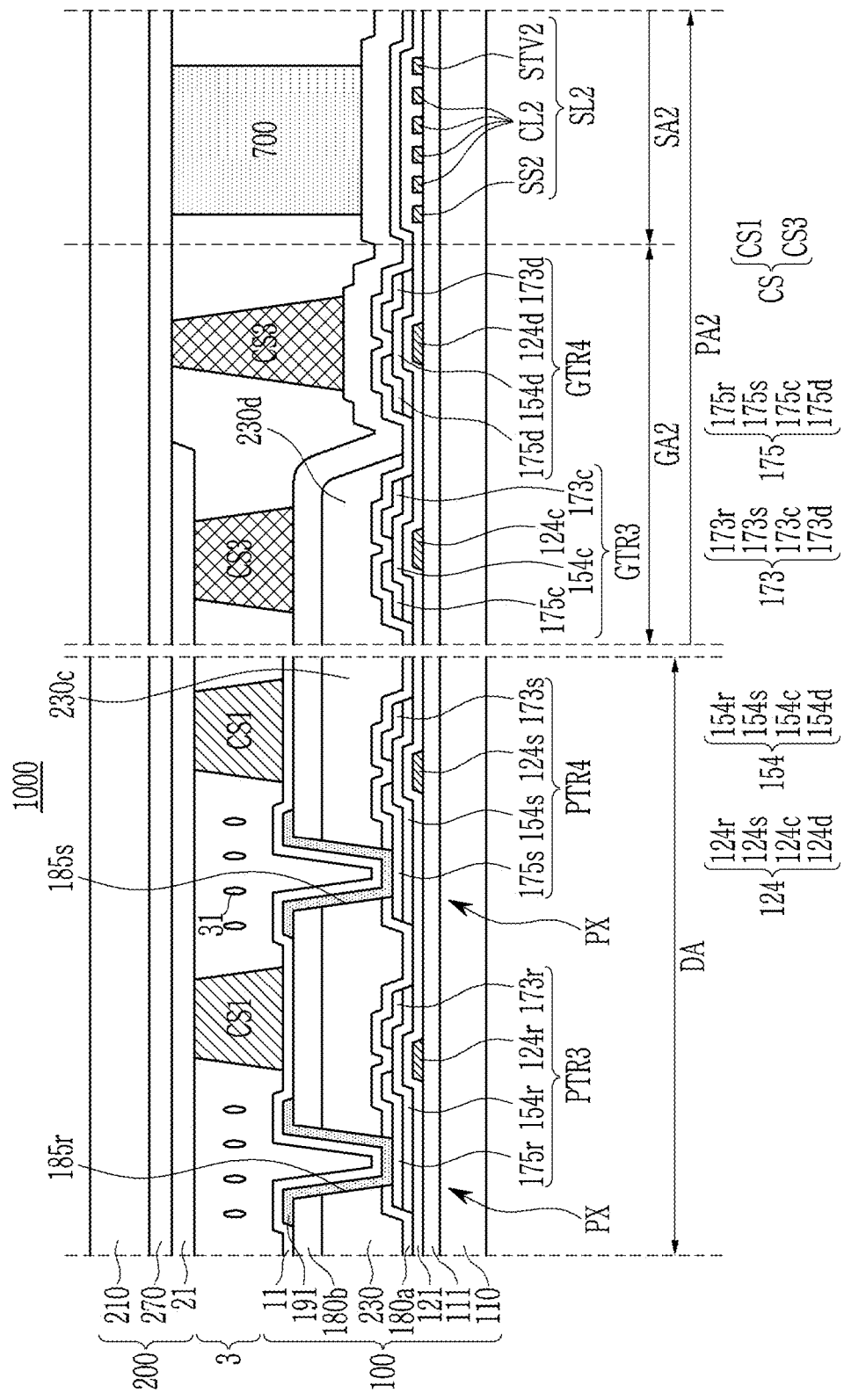
FIG. 8 illustrates a cross-sectional view taken along line VIII-VIII' of FIG. 6.

Therefore, according to the display device manufactured by using the exposure mask 10 according to the embodiment, a sum of densities of the column spacers CS2 and CS3 (see FIG. 7 and FIG. 8) respectively patterned in the two driving areas GA1 and GA2 (see FIG. 6) by the two boundary portions GSL1 and GSR2 may be same as the density of the column spacer CS1 (see FIG. 7 and FIG. 8)

patterned in the display area DA (see FIG. 6). In this case, assuming that the areas of the two driving areas GA1 and GA2 are the same, the density may represent the number of column spacers CS2 and CS3 (see FIG. 7 and FIG. 8) disposed per area of respective driving areas GA1 and GA2.

Hereinafter, a display device manufactured using the exposure mask 10 according to the embodiment will be described with reference to FIG. 6. FIG. 6 illustrates a schematic top plan view of a display device according to an embodiment.

Referring to FIG. 6, a display device 1000 according to an embodiment includes a display panel 300, a gate driver 400, a data driver 500, a printed circuit board 600, and a sealant 700.

The display panel 300 may be included in various flat panel displays (FPDs) such as liquid crystal displays (LCDs), organic light emitting displays (OLEDs), and electrowetting displays (EWDs). Hereinafter, a case in which the display device is a liquid crystal display will be described as an example.

The display panel 300 includes a first display panel 100 and a second display panel 200. A liquid crystal layer 3 (see FIG. 7) may be interposed between the first display panel 100 and the second display panel 200.

The display panel 300 includes a display area DA that displays an image and a peripheral area PA that does not display an image.

In the display area DA, a plurality of gate lines (GL1, GL2, . . . , and GLn, hereinafter collectively referred to as GLi), a plurality of data lines (D1, D2, . . . , and Dm, hereinafter collectively referred to as Dj), and a plurality of pixels PX connected to the plurality of gate lines GLi and the plurality of data lines Dj are disposed. The gate lines GLi may transmit a gate signal, extend in a substantially row-like direction (hereinafter referred to as a first direction D1), and be substantially parallel to each other. The data lines Dj may transmit a data voltage corresponding to an image signal, extend in a substantially columnar direction (hereinafter referred to as a second direction D2), and be substantially parallel to each other.

The plurality of pixels PX are substantially arranged in a matrix. Each pixel PX may include a transistor connected to a corresponding gate line GLi and a corresponding data line Dj, and a pixel electrode 191 (see FIG. 7) connected to the transistor.

The peripheral area PA is disposed around the display area DA. The peripheral area PA may be covered by a light blocking member such as a bezel. The peripheral area PA may surround the display area DA or be disposed at an edge of the display area DA.

In the display device according to the embodiment, the peripheral area PA includes a first peripheral area PA1 and a second peripheral area PA2 disposed at respective sides of the display area DA.

The first peripheral area PA1 is disposed on one (e.g., a first) side of the display area DA, and the second peripheral area PA2 is disposed at the other side (e.g., a second side) of the display area DA spaced apart (and opposite from) from the one side in the first direction D1. The first peripheral area PA1 and the second peripheral area PA2 may each extend along the second direction D2 on respective sides of the display area DA. Hereinafter, the first peripheral area PA1 may be described as the left side of the display area DA, and the second peripheral area PA2 may be described as the right side of the display area DA.

The first column spacer CS1 may be disposed in the display area DA, the second column spacer CS2 may be disposed in the first peripheral area PA1, and the third column spacer CS3 may be disposed in the second peripheral area PA2. The second column spacer CS2 may be irregularly disposed in the first peripheral area PA1, and the third column spacer CS3 may also be irregularly disposed in the second peripheral area PA2.

When the first peripheral area PA1 and the second peripheral area PA2 are moved in the first direction D1 and overlapped with each other in a plan view, a planar sum of the patterns in which the second column spacer CS2 and the third column spacer CS3 are disposed may be the same as a portion of the pattern in which the first column spacer CS1 is disposed. When the first peripheral area PA1 and the second peripheral area PA2 overlap each other, the second column spacer CS2 and the third column spacer CS3 may be spaced apart from each other. An arrangement relationship between the second column spacer CS2 and the third column spacer CS3 will be described in more detail with reference to FIG. 9 to FIG. 12.

The peripheral area PA includes the gate driver 400, the data driver 500, the control signal line SL, the sealant 700, and the column spacer CS. In some embodiments, for example, the gate line GLi and the data line Dj may extend in the peripheral area PA.

The printed circuit board 600 may include a signal controller 650 to control the gate driver 400 and the data driver 500. The signal controller 650 may be mounted on the printed circuit board 600. The signal controller 650 receives an input image signal and an input control signal to control display thereof from an external graphics controller to generate a gate control signal and a data control signal.

The gate control signal includes a scan start signal to indicate a scan start, at least one clock signal to control an output period of a gate-on voltage, at least one low voltage, and/or the like. The data control signal includes a horizontal synchronization start signal, a load signal, a data clock signal, and/or the like to indicate start of transmission of a digital image signal for one row of pixels PX.

The gate driver 400 receives a control signal such as a gate control signal through a control signal line SL connected to the data driver 500 to generate a gate signal including a gate on voltage and a gate off voltage, and applies the gate signal to the gate line GLi.

The gate driver 400 according to the embodiment includes a first gate driver 410 and a second gate driver 420. The first gate driver 410 is disposed in the first peripheral area PA1, and the second gate driver 420 is disposed in the second peripheral area PA2. Hereinafter, an area in which the first gate driver 410 is disposed is referred to as a first driving area GA1, and an area in which the second gate driver 420 is disposed is referred to as a second driving area GA2.

In the display device according to the embodiment, the column spacers CS2 and CS3 are disposed in the first driving area GA1 and the second driving area GA2. A sum of total densities of the column spacers CS2 and CS3 disposed in the first and second driving areas GA1 and GA2 may be the same as the density of the column spacer CS1 included in the display area DA.

In other words, the column spacer CS may be irregularly disposed at both edges (for example, the driving areas GA1 and GA2) of the display device 1000, and thus, the number of shots of the exposure mask 10 (see FIG. 1) used to manufacture the display device may be reduced.

The control signal line SL includes a first control signal line SL1 to apply a control signal to the first gate driver 410 and a second control signal line SL2 to control a control signal to the second gate driver 420. The first control signal line SL1 extends along the second direction D2 in the first peripheral area PA1, and the second control signal line SL2 extends along the second direction D2 in the second peripheral area PA2.

The control signal line SL may include a scan start signal line to transmit a scan start signal, a clock signal line, and a low voltage line to transmit a low voltage. The clock signal line may include a plurality of clock signal lines that transmit different clock signals.

The gate driver 400 includes a plurality of stages (STa1, STa2, STan/STb1, STb2, . . . , and STbn; hereinafter generically or collectively referred to as ST) sequentially arranged. The plurality of stages ST are dependently connected to each other, and are connected to the gate lines GLi, respectively. The stage ST may generate gate signals and sequentially transmit the gate signals to the gate lines GLi. Each stage ST may have a gate signal output terminal that is connected to each of the gate lines GLi to output a gate signal.

The plurality of stages ST may include first stages STa1, STa2, . . . , and STan included in the first gate driver 410, and second stages STb1, STb2, . . . , and STbn included in the second gate driver 420. The first stages STa1, STa2, . . . , and STan may be arranged in a line along the second direction D2 in the first driving area GA1. The second stages STb1, STb2, . . . , and STbn may be arranged in a line along the second direction D2 in the second driving area GA2. In some embodiments, the stage ST may be disposed at any one of the peripheral areas.

The data driver 500 is connected to the data lines Dj to transmit a data voltage to the data lines Dj. The data driver 500 may receive a data control signal and one digital image signal from the signal controller 650 and select a gray voltage. Thereafter, the digital image signal is converted into an analog data signal, and then the analog data signal is applied to a corresponding data line Dj.

The data driver 500 may include a plurality of data driving chips 520 and a plurality of flexible circuit boards 510 on which the data driving chips 520 are mounted. The data driving chips 520 output data signals to the data lines Dj, and the flexible circuit board 510 electrically connects the printed circuit board 600 and the display panel 300. In some embodiments, the data driving chip 520 may be directly integrated in the peripheral area PA through the same process as the transistor of the display area DA.

The sealant 700 may be disposed to surround the display area DA and the driving areas GA1 and GA2. The sealant 700 serves to bond the first display panel 100 and the second display panel 200 together. The sealant 700 may include a frit, but is not limited thereto, and may include various organic materials or inorganic materials capable of bonding the first display panel 100 and the second display panel 200 to each other.

The sealant 700 may be disposed to surround four edges of the display area DA. Areas where the sealant 700 is disposed are referred to as sealing areas SA1 and SA2, and the sealing areas SA1 and SA2 include a first sealing area SA1 and a second sealing area SA2.

The first sealing area SA1 is an area in which the sealant 700 extending in the second direction D2 in the first peripheral area PA1 is disposed. The first peripheral area PA1 includes the first driving area GA1 and the first sealing area SA1. The first driving area GA1 is disposed between the display area DA and the first sealing area SA1. The sealant 700 and the first control signal line SL1 may overlap in the first sealing area SA1.

The second sealing area SA2 is an area in which the sealant 700 extending in the second direction D2 in the second peripheral area PA2 is disposed. The second peripheral area PA2 includes the second driving area GA2 and the second sealing area SA2. The second driving area GA2 is disposed between the display area DA and the second sealing area SA2. The sealant 700 and the second control signal line SL2 may overlap in the second sealing area SA2.

In the display device according to the embodiment, the column spacer CS is disposed in the display area DA and the driving areas GA1 and GA2, but not in the sealing area SA. When the column spacer CS is disposed in the sealing area SA, a step may occur in the sealant 700, resulting in a defect in which an edge of the display panel 300 is viewed (e.g., viewable), and the adhesive force of the sealant 700 may be decreased.

Therefore, in the display device according to the embodiment, the column spacer CS is disposed in the driving areas GA1 and GA2 between the display area DA and the sealing areas SA1 and SA2, thereby improving display quality and increasing reliability of the display device.

In FIG. 6, the peripheral area PA is illustrated to surround the display area DA, but a position of the peripheral area PA is not limited thereto. According to another embodiment, the display area DA may be divided into a plurality of small areas, and a portion of the peripheral area PA may exist between adjacent small areas.

Portion CA', portion CB', and portion 'C' shown in FIG. 6 will be described in more detail with reference to FIG. 9 to FIG. 12.

Hereinafter, a portion of a display device according to an embodiment will be described with reference to FIG. 7. FIG. 7 illustrates a cross-sectional view taken along line VII-VII' of FIG. 6. FIG. 7 illustrates the first peripheral area PA1 of the display device 1000 and a portion of the display area DA adjacent thereto.

Referring to FIG. 7, the display device according to the embodiment includes the first display panel 100 and the second display panel 200 facing each other, and the liquid crystal layer 3 disposed therebetween. The column spacer CS and the sealant 700 are disposed between the first display panel 100 and the second display panel 200.

In the display device according to the embodiment, the column spacer CS may include the first column spacer CS1 and the second column spacer CS2.

The first column spacer CS1 is disposed in the display area DA, and may overlap display transistors PTR1 and PTR2 as an example. A density of the first column spacer CS1 included in the pixel PX of the display device 1000 may vary, but may have a substantially uniform density per area of a specific unit over the display area DA.

The second column spacer CS2 is disposed at the first driving area GA1, for example, between the display area DA and the first sealing area SA1. The second column spacer CS2 may overlap at least some of peripheral transistors GTR1 and GTR2. For example, the second column spacer CS2 may overlap the first peripheral transistor GTR1 and may not overlap the second peripheral transistor GTR2. In some embodiments, the second column spacer CS2 may overlap the second peripheral transistor GTR2 and may not overlap the first peripheral transistor GTR1.

Referring to FIG. 7, two first column spacers CS1 and one second column spacer CS2 are illustrated, but these multiplicities represent density rather than number. The density refers to the number of column spacers CS1 and CS2 disposed within the same area of the display area DA or the first driving area GA1.

The densities of the first column spacer CS1 and the second column spacer CS2 may be different. For example, the number of second column spacers CS2 disposed in one area of the first driving area GA1 may be smaller than the number of first column spacers CS1 disposed in the same area as the one area of the display area DA. For example, the density of the second column spacer CS2 may be half of the density of the first column spacer CS1. In some embodiments, the density of the first column spacer CS1 may be twice the density of the second column spacer CS2.

In the display device according to the embodiment, unlike other constituent elements, the second column spacer CS2 may have irregular density in the first driving area GA1. In contrast, a gate conductive layer, a data conductive layer, a pixel electrode 191, and the like on the first display panel 100, which will be described later, may be regularly formed to have a substantially uniform density. In some embodiments, for example, a gate insulating layer 121, insulating layers 180a and 180b, and the like on the first display panel 100, which will be described later, may be entirely formed on the first display panel 100. At least respective portions of the gate conductive layer (for example, at least a portion of a gate electrode 124) and the data conductive layer (for example, a source electrode 173 and a drain electrode 175) and a semiconductor layer 154 may form a transistor.

As such, by disposing the second column spacer CS2 in the first driving area GA1, the number of mask shots may be reduced to simplify a manufacturing process. For example, since the second column spacer CS2 may be disposed at an irregular density in the first driving area GA1, a stitch defect occurring at a boundary between adjacent masks may be reduced.

Further, since the second column spacer CS2 is not disposed in the first sealing area SA1, the problems of the edge being viewable and the adhesive force being reduced due to the step of the sealant 700 can be prevented or reduced.

In addition, since the second column spacer CS2 is disposed in the first driving area GA1, a short circuit between the electrodes of the two display panels 100 and 200 disposed above and below the first driving area GA1 may be prevented or reduced.

Hereinafter, the first display panel 100 will be described. Hereinafter, the first display panel 100 will be described according to the stacking order thereof, and then a description will be made for each area of the display device 1000.

The first display panel 100 includes a first substrate 110, and a buffer layer 111, a gate conductive layer, a gate insulating layer 121, a semiconductor layer 154, a data conductive layer, a first insulating layer 180a, a color filter layer 230, a second insulating layer 180b, and a pixel electrode 191 stacked on the first substrate 110. A first alignment film 11 may be disposed on the pixel electrode 191.

The first substrate 110 includes at least one of glass, quartz, ceramic, sapphire, plastic, and the like. The first substrate 110 may be rigid, flexible, stretchable, rollable, or foldable.

The buffer layer 111 may be disposed on the first substrate 110. The buffer layer 111 may include an inorganic insulating material or an organic insulating material. The buffer layer 111 may prevent or reduce impurities from flowing into a thin film transistor, and may flatten (e.g., planarize) one surface of the first substrate 110. In some embodiments, the buffer layer 111 may be omitted (e.g., may not be included).

A gate conductive layer including the gate electrode 124, a gate line, and the first control signal line SL1 is disposed on the buffer layer 111. In FIG. 7, a plurality of gate electrodes 124 are illustrated. The gate line may correspond to the gate line GLi of FIG. 6. The gate electrode 124 may include a first gate electrode 124p and a second gate electrode 124q disposed in the display area DA, and a third gate electrode 124a and a fourth gate electrode 124b disposed in the first peripheral area PA1.

The first control signal line SL1 may include a first scan start signal line STV1 to transmit a scan start signal, a first clock signal line CL1, a first low voltage line SS1 to transmit a low voltage, and the like. The first clock signal line CL1 may include a plurality of clock signal lines that transmit different clock signals. In FIG. 7, four first clock signal lines CL1 are illustrated, but the number of first clock signal lines CL1 is not limited thereto.

The gate insulating layer 121 is disposed on the gate conductive layer. The gate insulating layer 121 may include an inorganic insulating material such as a silicon oxide or a silicon nitride.

The semiconductor layer 154 is disposed on the gate insulating layer 121. The semiconductor layer 154 may include a semiconductor material such as an oxide semiconductor, amorphous silicon, or polycrystalline silicon, but is not limited thereto. The semiconductor layer 154 may include first to fourth semiconductor layers 154p, 154q, 154a, and 154b.

A data conductive layer including the source electrode 173, the drain electrode 175, and the data line is disposed on the semiconductor layer 154. In FIG. 7, a plurality of source electrodes 173 and a plurality of drain electrodes 175 are illustrated, and a data line is not separately illustrated. The data line may correspond to the data line Dj of FIG. 6. The source electrode 173 and the drain electrode 175 may be integrally formed with the data line, or may be spaced apart from the data line.

The source electrode 173 may include a first source electrode 173p and a second source electrode 173q disposed in the display area DA, and a third source electrode 173a and a fourth source electrode 173b disposed in the first peripheral area PA1. The drain electrode 175 may include a first drain electrode 175p and a second drain electrode 175q disposed in the display area DA, and a third drain electrode 175a and a fourth drain electrode 175b disposed in the first peripheral area PA1.

The first insulating layer 180a including an inorganic insulating material (such as a silicon oxide (SiOx) and a silicon nitride (SiNx)) or an organic insulating material is disposed on the data conductive layer.

The color filter layer 230 is disposed on the first insulating layer 180a. The color filter layer 230 may include a plurality of color filters displaying different colors, and each color filter may include an organic material including a dye representing a color displayed by the corresponding pixel PX. The pixel PX illustrated in FIG. 7 may correspond to the pixel PX described with reference to FIG. 1.

The second insulating layer 180b including an inorganic insulating material such as a silicon oxide (SiOx) and a silicon nitride (SiNx) or an organic insulating material may be disposed on the color filter layer 230. The second insulating layer 180b may prevent or reduce a material of the color filter layer 230 from leaking into the liquid crystal layer 3.

Openings 185p and 185q exposing the drain electrodes 175p and 175q are formed in the first insulating layer 180a, the color filter layer 230, and the second insulating layer 180b.

The pixel electrode 191 is disposed on the second insulating layer 180b. The pixel electrode 191 may include a transparent conductive material (such as an indium tin oxide (ITO) or an indium zinc oxide (IZO)) or a metal such as aluminum, silver, chromium, or an alloy thereof.

The pixel electrode 191 may be disposed in the display area DA. The pixel electrode 191 is physically and electrically connected to the drain electrodes 175p and 175q through the openings 185p and 185q, and receives a data voltage from the drain electrodes 175p and 175q.

In some embodiments, the pixel electrode 191 may further include a shielding electrode to which the same voltage as that of a common electrode 270 described later is applied.

The first alignment film 11 may be disposed on the pixel electrode 191.

The column spacer and the sealant 700 are disposed on the first alignment film 11 or the second insulating layer 180b.

The column spacer CS serves to maintain a gap between the two display panels 100 and 200 by being formed between the first display panel 100 and the second display panel 200. For example, the cell gap of the liquid crystal layer 3 interposed between the first display panel 100 and the second display panel 200 may be made substantially uniform. The column spacer includes the first column spacer CS1 disposed in the display area DA and the second column spacer CS2 disposed in the first driving area GA1.

The sealant 700 serves to bond the two display panels 100 and 200 between the first display panel 100 and the second display panel 200. The sealant 700 may overlap at least a portion of the first control signal line SL1 disposed in the first sealing area SA1 and disposed therebelow.

The liquid crystal layer 3 including liquid crystal molecules 31 is disposed between the first display panel 100 and the second display panel 200. The pixel electrode 191 to which a data voltage is applied generates an electric field together with the common electrode 270 (described later) to determine the direction of the liquid crystal molecules 31 of the liquid crystal layer 3 between the two electrodes 191 and 270. Accordingly, the luminance of light passing through the liquid crystal layer 3 is changed.

Hereinafter, areas of the first display panel 100 will be described.

The first display panel 100 includes the display area DA including the pixel PX and the first peripheral area PA1 other than the display area. The first peripheral area PA1 includes the first driving area GA1 and the first sealing area SA1 disposed outside the first driving area GA1. The pixel PX may be formed in the display area DA, and includes display transistors PTR1 and PTR2 described later and the pixel electrode 191. The pixel PX may correspond to one pixel PX shown in FIG. 6, but is not limited thereto.

The display transistors PTR1 and PTR2 are disposed in the display area DA. In FIG. 7, only two display transistors PTR1 and PTR2 of the plurality of display transistors are shown for convenience of description.

The first gate electrode 124p, the first source electrode 173p, and the first drain electrode 175p form the first display transistor PTR1 together with the first semiconductor layer 154p. A channel of the first display transistor PTR1 may be formed in a portion of the first semiconductor layer 154p between the first source electrode 173p and the first drain electrode 175p.

The second gate electrode 124q, the second source electrode 173q, and the second drain electrode 175q described above form the second display transistor PTR2 together with the second semiconductor layer 154q. A channel of the second display transistor PTR2 may be formed in a portion of the second semiconductor layer 154q between the second source electrode 173p and the second drain electrode 175q.

The peripheral transistors GTR1 and GTR2 are disposed in the first driving area GA1. In FIG. 7, only two peripheral transistors GTR1 and GTR2 of the plurality of peripheral transistors are shown for convenience of description.

The third gate electrode 124a, the third source electrode 173a, and the third drain electrode 175a described above form the first peripheral transistor GTR1 together with the third semiconductor layer 154a. A channel of the first peripheral transistor GTR1 may be formed in a portion of the third semiconductor layer 154a between the third source electrode 173a and the third drain electrode 175a.

The fourth gate electrode 124b, the fourth source electrode 173b, and the fourth drain electrode 175b described above form the second peripheral transistor GTR2 together with the fourth semiconductor layer 154b. A channel of the second peripheral transistor GTR2 may be formed in a portion of the fourth semiconductor layer 154b between the fourth source electrode 173b and the fourth drain electrode 175b.

In this case, the first color filter 230a may be disposed on the first display transistor PTR1, and the second color filter 230b may be disposed on the second peripheral transistor GTR2. The second color filter 230b may be a portion in which the first color filter 230a extends, and may be formed separately from the first color filter 230a.

Hereinafter, the second display panel 200 will be described. The second display panel 200 includes a second substrate 210, and a common electrode 270 and a second alignment film 21 stacked on the second substrate 210.

The second substrate 210 includes at least one of glass, quartz, ceramic, sapphire, plastic, and/or the like. The second substrate 210 may be rigid, flexible, stretchable, rollable, or foldable.

The common electrode 270 is disposed on the second substrate 210. The common electrode 270 may be made of a transparent conductive material, such as an indium tin oxide (ITO), an indium zinc oxide (IZO), an indium tin zinc oxide (ITZO), and/or an Al-doped zinc oxide (AZO). In some embodiments, the common electrode 270 may be formed as a whole (e.g., single unitary) plate over an entire surface of the second substrate 210. In some embodiments, however, a slit or an opening may be formed in the common electrode 270. A common voltage provided from the outside may be applied to the common electrode 270 to form an electric field in the liquid crystal layer 3 together with the pixel electrode 191 of the first display panel 100.

The second alignment film 21 may be disposed on the common electrode 270.

In the above-described embodiment, a switching element included in one pixel PX is illustrated as a transistor (which is a three-terminal element), but the switching element is not limited thereto. For example, although one pixel PX is illustrated as including one transistor, the number of transistors included in one pixel PX is not limited thereto.

Hereinafter, another portion of the display device according to the embodiment will be described with reference to FIG. 8. FIG. 8 illustrates a cross-sectional view taken along line VIII-VIII' of FIG. 6. FIG. 8 illustrates the second peripheral area PA2 of the display device and a portion of the display area DA adjacent thereto. A description of the same components as those described with reference to FIG. 7 will not be provided again. First, the first display panel will be described according to the stacking order thereof, and then a description will be made for each area of the display device.

A gate conductive layer including the gate electrode 124, the gate line, and the second control signal line SL2 is disposed on the buffer layer 111. The gate electrode 124 may include fifth, sixth, seventh, and eighth gate electrodes 124r, 124s, 124c, and 124d.

The second control signal line SL2 may include a second scan start signal line STV2 to transmit a scan start signal, a second clock signal line CL2, a second low voltage line SS2 to transmit a low voltage, and the like. The second clock signal line CL1 may include a plurality of clock signal lines that transmit different clock signals. In FIG. 8, four second clock signal lines CL2 are illustrated, but the number of second clock signal lines CL2 is not limited thereto.

The semiconductor layer 154 may include fifth to eighth semiconductor layers 154r, 154s, 154c, and 154d.

The source electrode 173 may include fifth to eighth source electrodes 173r, 173s, 173c, and 173d, and the drain electrode 175 may include fifth to eighth drain electrodes 175r, 175s, 175c, and 175d.

Hereinafter, respective areas of the first display panel 100 will be described.

Display transistors PTR3 and PTR4 are disposed in the display area DA. In

FIG. 8, only two display transistors PTR3 and PTR4 of the plurality of display transistors are shown for convenience of description.

The fifth gate electrode 124r, the fifth source electrode 173r, and the fifth drain electrode 175r form the third display transistor PTR3 together with the fifth semiconductor layer 154r. A channel of the third display transistor PTR3 may be formed in a portion of the fifth semiconductor layer 154r between the fifth source electrode 173r and the fifth drain electrode 175r.

The sixth gate electrode 124s, the sixth source electrode 173s, and the sixth drain electrode 175s form the fourth display transistor PTR4 together with the sixth semiconductor layer 154s. A channel of the fourth display transistor PTR4 may be formed in a portion of the sixth semiconductor layer 154s between the sixth source electrode 173s and the sixth drain electrode 175s.

Openings 185r and 185s exposing the drain electrodes 175r and 175s are formed in the first insulating layer 180a, the color filter layer 230, and the second insulating layer 180b.

Peripheral transistors GTR3 and GTR4 are disposed in the second driving area GA2. In FIG. 8, only two peripheral transistors GTR3 and GTR4 of the plurality of peripheral transistors are shown for convenience of description.

The seventh gate electrode 124c, the seventh source electrode 173c, and the seventh drain electrode 175c form the third peripheral transistor PTR3 together and the seventh semiconductor layer 154c. A channel of the third peripheral transistor GTR3 may be formed in a portion of the seventh semiconductor layer 154c between the seventh source electrode 173c and the seventh drain electrode 175c.

The eighth gate electrode 124d, the seventh source electrode 173d, and the seventh drain electrode 175d form the fourth peripheral transistor PTR4 together and the eighth semiconductor layer 154d. A channel of the fourth peripheral transistor GTR4 may be formed in a portion of the eighth semiconductor layer 154d between the eighth source electrode 173d and the eighth drain electrode 175d.

In this case, a third color filter 230c may be disposed on the fourth display transistor PTR4, and a fourth color filter 230d may be disposed on the third peripheral transistor GTR3. The fourth color filter 230d may be a portion in which the third color filter 230c extends, and may be formed separately from the third color filter 230c.

The sealant 700 is disposed in the second sealing area SA2 of the first display panel 100, and the column spacer includes the first column spacer CS1 disposed in the display area DA and a third column spacer CS3 disposed in the second driving area GA2.

The first column spacer CS1 is disposed in the display area DA, and two of the first column spacer CS1 respectively overlap the display transistors PTR3 and PTR4. A density of the first column spacer CS1 included in the pixel PX of the display device 1000 may vary, but may have a substantially uniform density per area of a specific unit over the display area DA.

The third column spacer CS3 is disposed at the second driving area GA2, for example, between the display area DA and the second sealing area SA2. The third column spacer CS3 may overlap at least some of the peripheral transistors GTR3 and GTR4. For example, two of the third column spacer CS3 may be respectively disposed on the third peripheral transistor GTR3 and the fourth peripheral transistor GTR4. In some embodiments, the third column spacer CS3 may be disposed on only one of the third peripheral transistor GTR3 and the fourth peripheral transistor GTR4.

As shown in FIG. 8, the densities of the column spacers CS1 and CS3 included in the display area DA and the second driving area GA2 may be the same. Referring to FIG. 8, two first column spacers CS1 and two third column spacers CS3 are respectively illustrated, and they represent density rather than number. The density refers to the number of column spacers CS1 and CS2 disposed in the same area of the display area DA or the second driving area GA2.

The densities of the first column spacer CS1 and the third column spacer CS3 may be substantially equal to each other in their respective unit areas. For example, the density of the third column spacer CS3 disposed in one area of the second driving area GA2 may be the same as that of first column spacer CS1 disposed in an equivalent area of the display area DA.

In some embodiments, the densities of the first column spacer CS1 and the second column spacer CS3 may be different. For example, the density of the third column spacer CS3 may be half of the density of the first column spacer CS1. In some embodiments, the density of the first column spacer CS1 may be twice the density of the third column spacer CS3.

In this case, referring to FIG. 8 together with FIG. 7, the density of the third column spacer CS3 may be different from that of the second column spacer CS2 (see FIG. 7) in the corresponding area. For example, the second and third column spacers CS2 and CS3 may respectively have irregular densities in the driving areas GA1 and GA2.

In the display device according to the embodiment, unlike other constituent elements, the third column spacer CS3 may have an irregular density in the second driving area GA2.

As such, by arranging the third column spacer CS3 in the second driving area GA2, the number of mask shots may be reduced to simplify the manufacturing process, and the stitch defects occurring at the boundary between adjacent masks may be reduced.

Since the third column spacer CS3 is not disposed in the second sealing area SA2, the problems of the edge being viewed and the adhesive force being reduced due to the step of the sealant 700 may be prevented or reduced.

In some embodiments, since the third column spacer CS3 is disposed in the second driving area GA2, a short circuit between the electrodes of the two display panels 100 and 200 may be prevented or reduced in the second driving area GA2.

Hereinafter, a display device manufactured by using the exposure mask 10 according to the embodiment will be described with reference to FIG. 9 to FIG. 12 together with FIG. 6.

Figure 9:
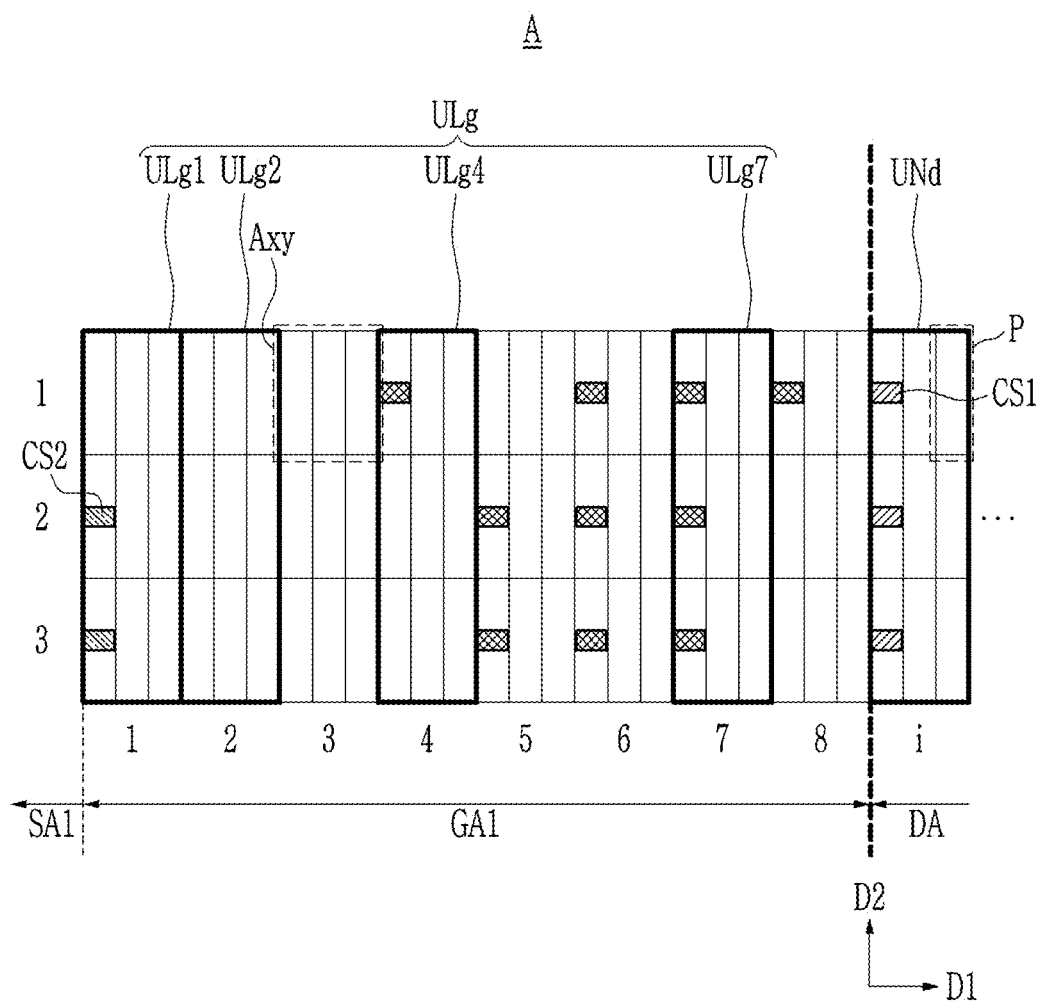
FIG. 9 is a top plan view schematically illustrating a portion of the display device according to the embodiment of FIG. 6.
Figure 10:
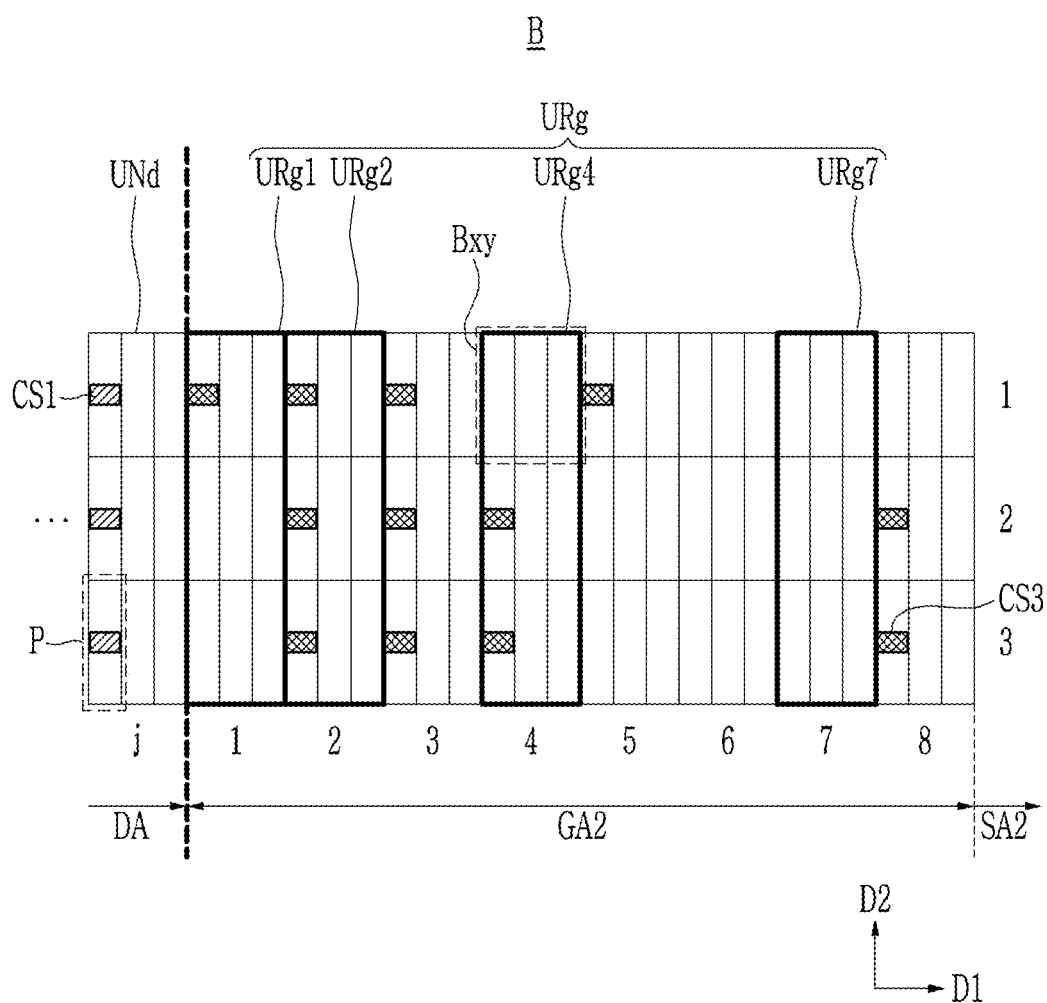
FIG. 10 is a top plan view schematically illustrating another portion of the display device according to the embodiment of FIG. 6.
Figure 11:
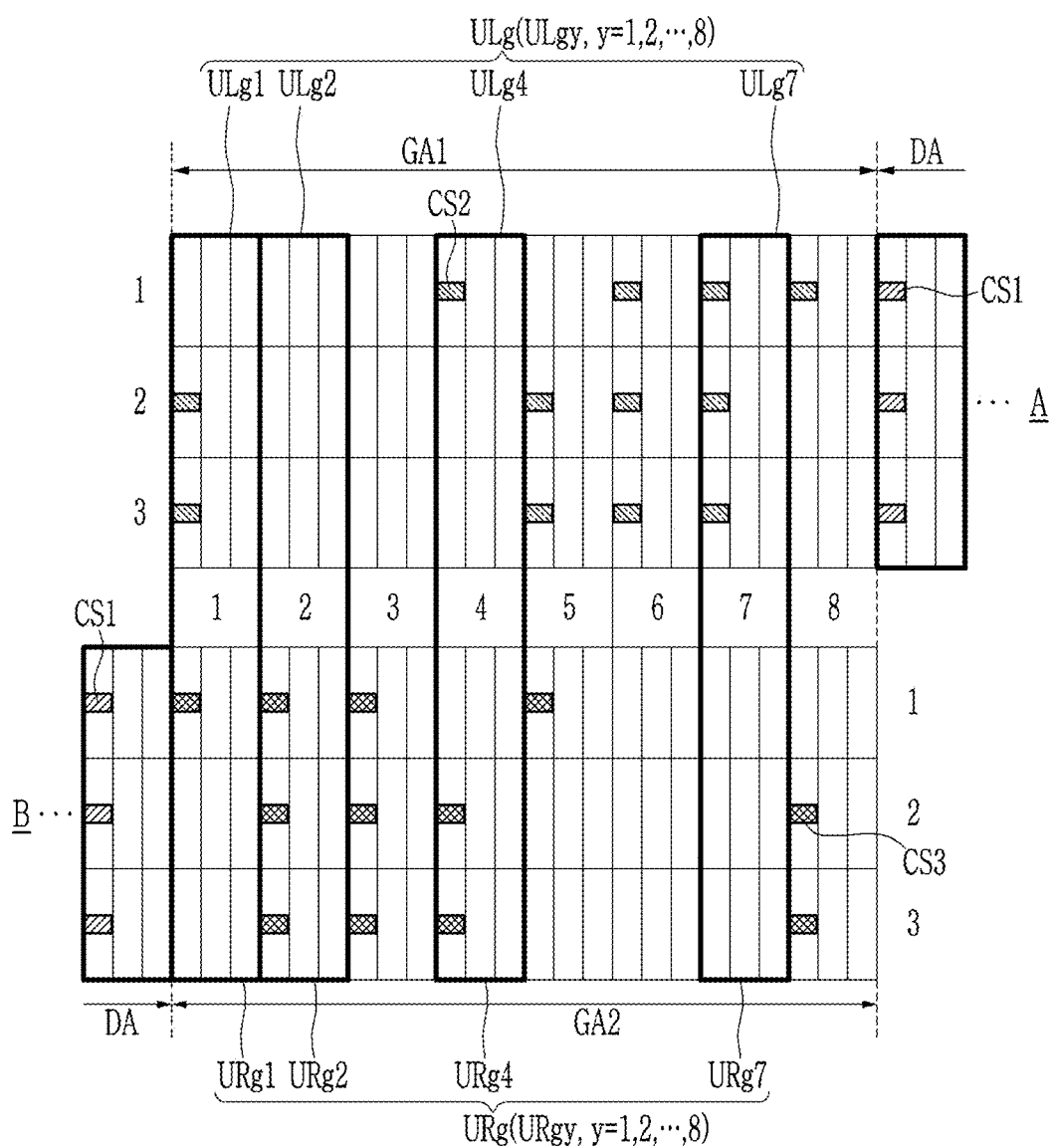
FIG. 11 is a top plan view in which the portions of the display devices of FIG. 9 and FIG. 10 are aligned with each other.
Figure 12:
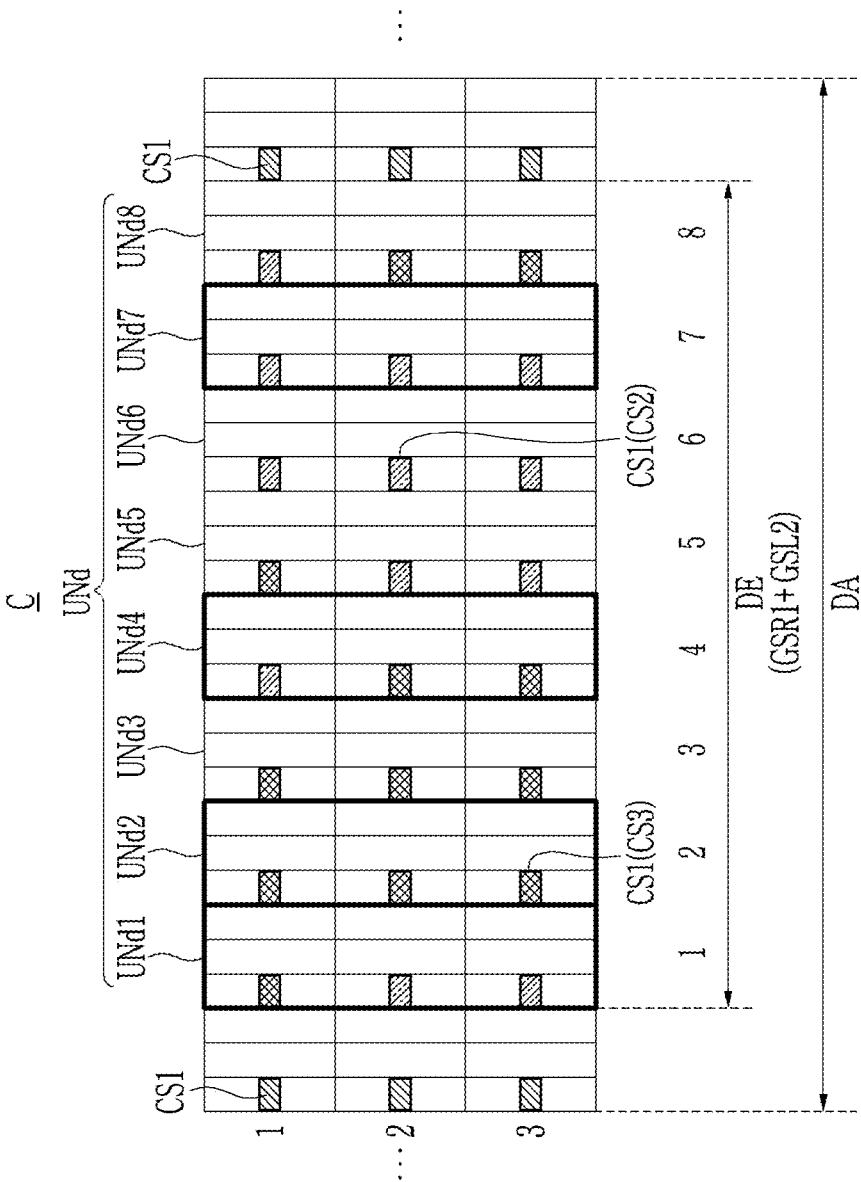
FIG. 12 is a top plan view schematically illustrating another portion of the display device according to the embodiment of FIG. 6.

FIG. 9 is a top plan view schematically illustrating a portion of the display device according to the embodiment of FIG. 6, FIG. 10 is a top plan view schematically illustrating another portion of the display device according to the embodiment of FIG. 6, FIG. 11 is a top plan view in which the portions of the display devices of FIG. 9 and FIG. 10 are aligned with each other, and FIG. 12 is a top plan view schematically illustrating another portion of the display device according to the embodiment of FIG. 6. Hereinafter, constituent elements and contents that are the same as or similar to those in the above-described embodiment will not be further described.

Referring first to FIG. 9, the portion A of the display device according to the embodiment of FIG. 6 is shown. The portion A may include the first driving area GA1 and a portion of the display area DA adjacent thereto.

The first driving area GA1 is disposed between the display area DA and the first sealing area SA1. The portion A may be a portion exposed by the first group G1 shown in FIG. 2.

The first driving area GA1 of the portion A may include eight left driving unit areas ULg, and the display area DA of the portion A may include one general display unit area UNd. Each left driving unit area ULg may be a portion exposed by each left unit UL described above with reference to FIG. 3. The general display unit area UNd may be a portion exposed by the general unit UN described above with reference to FIG. 3 and FIG. 4.

The portion A may be partitioned into, for example, a matrix formed of 3 rows by 9 columns. Hereinafter, it will be described that a row direction corresponds to the first direction D1 and a column direction corresponds to the second direction D2. A portion corresponding to 1 row and 1 column is referred to as one block, and each block may be referred to as an Axy block, wherein x represents the row index and y represents the column index, and in FIGS. 9, x=1, 2, 3, and y=1, 2, . . . , 9, where x=1 and y=1 start at the top left corner. The column included in the display area DA is illustrated as an i-th column to distinguish it from the first driving area GA1. One block (Axy) may correspond to one pixel PX shown in FIG. 6.

For example, each block ($A_{xy}$) may include three P areas, and the three P areas may correspond to one pixel PX shown in FIG. 6.

For example, each of the left driving unit area ULg and the general display unit area UNd may include three blocks, for example, nine pixels PX (see FIG. 6). However, the number of blocks included in one unit area ULg and UNd and the number of P areas included in one block are not limited thereto. For example, the area of the unit areas ULg and UNd may be variously set.

The general display unit area UNd of the portion A may include $A_{1i}$, $A_{2i}$, and $A_{3i}$ blocks (i is a positive integer) aligned in the second direction D2. Each of the $A_{1i}$, $A_{2i}$, and $A_{3i}$ blocks may include one first column spacer CS1.

In FIG. 9, although the first column spacer CS1 is illustrated as being disposed in the same P area column in each block ($A_{1i}$, $A_{2i}$, $A_{3i}$), the first column spacer CS1 may be disposed in different P area columns (e.g., in any suitable column).

The first driving area GA1 of the portion A is configured to include eight left driving unit areas ULg aligned along the first direction D1.

Each left driving unit area ULg of the portion A may include three blocks aligned in the second direction D2. One block may or may not include the second column spacer CS2. Hereinafter, for convenience of description, the first, second, fourth, and seventh left driving unit areas ULg1, ULg2, ULg4, and ULg7 will be described as examples.

For example, the first left driving unit area ULg1 includes $A_{11}$, $A_{21}$, and $A_{31}$ blocks, and the $A_{11}$ block may not include the second column spacer CS2, while $A_{21}$ and $A_{31}$ blocks may include the second column spacer CS2, respectively.

The second left driving unit area ULg2 includes A12, $A_{22}$, and $A_{32}$ blocks, and all the $A_{12}$, $A_{22}$, and $A_{32}$ blocks may not include the second column spacer CS2.

The fourth left driving unit area ULg4 includes $A_{14}$, $A_{24}$, and $A_{34}$ blocks, and the A14 block may include the second column spacer CS2, while $A_{24}$ and $A_{34}$ blocks may not include the second column spacer CS2.

The seventh left driving unit area ULg7 includes $A_{17}$, $A_{27}$, and $A_{37}$ blocks, and all the $A_{17}$, $A_{27}$, and $A_{37}$ blocks may include the second column spacer CS2.

FIG. 9 depicts that the first column spacer CS1 is disposed in the first P area column in each left driving unit area ULg. However, the first column spacer CS1 may be disposed in any P area column in the block.

In the display device according to the embodiment, the second column spacer CS2 may be irregularly distributed throughout the first driving area GA1. In contrast, the first column spacer CS1 may have a substantially uniform density (e.g., position with respect to a grid) throughout the display area DA.

Next, referring to FIG. 10, the portion B of the display device according to the embodiment of FIG. 6 is shown. The portion B may include the second driving area GA2 and a portion of the display area DA adjacent thereto. The portion B has the same shape and area as the portion A in FIG. 9. Hereinafter, descriptions of the same components and contents as those described with reference to FIG. 9 will be simplified or omitted.

The second driving area GA2 is disposed between the display area DA and the second sealing area SA2. The portion B may be a portion exposed by the second group G2 shown in FIG. 2.

The second driving area GA2 of the portion B may include eight right driving unit areas URg, and the display area DA of the portion B may include one general display unit area UNd. Each right driving unit area URg may be a portion exposed by each right unit UR described above with reference to FIG. 4. The general display unit area UNd may be a portion exposed by the general unit UN described above with reference to FIG. 3 and FIG. 4.

The portion B may be partitioned into, for example, a matrix formed of 3 rows by 9 columns, and each block may be referred to as Bxy, where x=1 and y=1 start at the top left corner. One block (Bxy) may correspond to one pixel PX shown in FIG. 6. For example, each block (Bxy) may include three P areas, and the three P areas may correspond to one pixel PX shown in FIG. 6.

The general display unit area (UNd) in the portion B may include $B_{1j}$, $B_{2j}$, and $B_{3j}$ blocks (j is a positive integer). The column included in the display area DA is illustrated as a j-th column to distinguish it from the second driving area GA2. Each of $B_{1j}$, $B_{2j}$, and $B_{3j}$ blocks may include one first column spacer CS1.

The second driving area GA2 of the portion B may include eight right driving unit areas URg aligned along the first direction D1, and each right driving unit area URg may include three blocks aligned in the second direction D2. One (each) block may or may not include the third column spacer CS3. Hereinafter, for convenience of description, the first, second, fourth, and seventh right driving unit areas URg1, URg2, URg4, and URg7 will be described as examples.

The first right driving unit area URg1 includes $B_{11}$, $B_{21}$, and $B_{31}$ blocks, and the $B_{11}$ block may include the third column spacer CS3, while $B_{21}$ and $B_{31}$ blocks may not include the third column spacer CS3.

The second right driving unit area URg2 includes $B_{12}$, $B_{22}$, and $B_{32}$ blocks, and all the $B_{12}$, $B_{22}$, and $B_{32}$ blocks may include the third column spacer CS3.

The fourth right driving unit area URg4 includes $B_{14}$, $B_{24}$, and $B_{34}$ blocks, and the $B_{14}$ block may not include the third column spacer CS3, while $B_{24}$ and $B_{34}$ blocks may include the third column spacer CS3.

The seventh right driving unit area URg7 includes $B_{17}$, $B_{27}$, and $B_{37}$ blocks, and all the $B_{17}$, $B_{27}$, and $B_{37}$ blocks not may include the third column spacer CS3.

In the display device according to the embodiment, the third column spacer CS3 may be irregularly distributed throughout the second driving area GA2. In contrast, the first column spacer CS1 may have a substantially uniform density (e.g., consistent distribution) throughout the display area DA.

Referring to FIG. 11 together with FIG. 9 and FIG. 10, the portion A of FIG. 9 and the portion B of FIG. 11 are aligned for each column of the driving areas GA1 and GA2. For example, the left driving unit area ULg and the right driving unit area URg are respectively disposed in corresponding columns in the first driving area GA1 and the second driving area GA2.

A y-th left driving unit area ULg and a y-th right driving unit area URg are respectively referred to as a y-th left driving unit area ULgy and a y-th right driving unit area URgy. The left driving unit area ULgy and the right driving unit area URgy (y is the same positive integer) may be disposed at the same point in the first driving area GA1 and the second driving area GA2, respectively. For example, the first left driving unit area ULg1 and the first right driving unit area URg1 may be disposed at the same point of the same column (y=1) in the first driving area GA1 and the second driving area GA2, respectively.

In corresponding areas respectively disposed at the same point in the first driving area GA1 and the second driving area GA2, a pattern in which the second column spacer CS2 is disposed and a pattern in which the third column spacer CS3 is disposed may be different from each other. The set or predetermined area may be the y-th left driving unit area ULgy and the y-th right driving unit area URgy.

An opening area included in the y-th right driving unit area URgy may overlap a blocking area included in the y-th left driving unit area ULgy. In some embodiments, for example, an opening area included in the y-th left driving unit area ULgy may overlap a blocking area included in the y-th right driving unit area URgy.

In other words, when the y-th left driving unit area ULgy and the y-th right driving unit area URgy overlap in a plan view, the third column spacer CS3 may be spaced apart from the second column spacer CS2. For example, the third column spacer CS3 may be disposed in a block(s) in which the second column spacer CS2 is not disposed.

Accordingly, the sum of the patterns in which the column spacer CS2 of the y-th left driving unit area ULgy and the column spacer CS3 of the y-th right driving unit area URgy disposed (e.g., with respect to the corresponding columns) has a density that is the same as that of the pattern in which the first column spacer CS1 of the general display unit area UNd of the display area DA is disposed.

When the y-th left driving unit area ULgy and the y-th right driving unit area URgy overlap in a plan view, at least some of the peripheral transistors GTR1, GTR2, GTR3, and GTR4 respectively included in the driving unit areas ULgy and URgy may overlap. In some embodiments, the insulating layers 121, 180a, and 180b disposed in the driving unit areas ULgy and URgy may also overlap each other.

Referring to FIG. 12, the portion C of the display device according to the embodiment of FIG. 1 is shown. Hereinafter, the same components and contents as those described with reference to FIG. 9 to FIG. 11 will not be further described.

The portion C is a portion of the general display area DA of the display device. A portion of the display area DA of the portion C may be exposed by the double exposure area DE in which the first right boundary portion GSR1 and the second left boundary portion GSL2 of the exposure mask 10 (see FIG. 1) overlap.

The portion C may be a portion corresponding to the third group G3 of FIG. 5.

The portion C is shown to include a total of 10 general display unit areas UNd. The double exposure area DE of the portion C may include eight general display unit areas UNd, and the portion C may further include one general display unit area UNd at each side of the double exposure area DE. Each general display unit area UNd may include three blocks, and each block may be represented as Cxy (x=1, 2, 3, and y=1, 2, . . . , 10).

Referring to FIG. 12 together with FIG. 11, a pattern of each general display unit area UNd of the portion C is the same as the overlap (sum) of patterns of the left driving unit area ULg and the right driving unit area URg of the portion A and the portion B aligned in FIG. 11. For example, the pattern of the double exposure area DE of portion C is the same as the pattern of the first driving area GA1 and portion B described above, overlapped with the pattern of the second driving area GA2 of the portion B.

For convenience of description, only the first, second, fourth, and seventh general display unit areas UNd1, UNd2, UNd4, and UNd7 are shown. All the column spacers CS1 disposed in portion C correspond to the first column spacer CS1, but in order to show the overlapping patterns in the double exposure area DE, they are shown to be divided into the second column spacers CS2 or the third column spacers CS3 (in FIG. 12, they are shown in parentheses).

In the first general display unit area UNd1, since the first left driving unit area ULg1 and the first right driving unit area URg1 overlap, the first column spacer CS1 may be included in all the blocks (C11, C21, C31). Similarly, in the second, fourth and seventh general display unit areas UNd2, UNd4, and UNd7, since respective corresponding left driving unit areas ULg (see FIG. 11) and respective corresponding right driving unit areas URg (see FIG. 11) overlap, the first column spacer CS1 may be disposed in all the blocks.

Accordingly, the first column spacer CS1 of the portion C may have the same density (e.g., distribution) in all the general display unit areas UNd.

When one block includes the column spacer CS1, although it has been described as including one column spacer CS1 per block, in some embodiments the number of column spacers CS1 included in each block or each unit UN may vary.

As used herein, the singular forms "a," "an," and "the" are intended to include the plural forms as well, unless the context clearly indicates otherwise.

As used herein, expressions such as "at least one of", "one of", and "selected from", when preceding a list of elements, modify the entire list of elements and do not modify the individual elements of the list.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

While the present disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims and their equivalents.

| Description of Some of the Symbols | |
|---|---|
| 10: exposure mask | NA: non-overlapping |
| GSL: left boundary portion | GSR: right boundary portion |
| P1: first pattern | P2: second pattern |
| P3: third pattern | UL: left unit |
| UR: right unit | UN: general unit |
| BP, BPL, BPR: black pattern | WP, WPL, WPR: white pattern |
| OPL1, OPL2, OPR1, OPR2: opening area | |
| CPL1, CPL2, CPR1, CPR2: blocking area | |
| sp1, sp1-1, sp1-2: first point | sp2, sp2-1, sp2-2: second point |
| w1: first width | w2: second width |
| w3: third width | w4: fourth width |
| O1: first origin point | O2: second origin point |
| S1: first shot | S2: second shot |
| DE: double exposure area | |
| 1000: display device | 300: display |
| DA: display area | PA, PA1, PA2: peripheral area |
| GA1, GA2: driving area | 400, 410, 420: gate driver |
| SL, SL1, SL2: control signal line | SA1, SA2: sealing area |
| 700: sealant | PX: pixel |
| CS: column spacer | CS1: first column spacer |
| CS2: second column spacer | CS3: third column spacer |
| 100: first display panel | 200: second display panel; |
| 500: data driver | 600: printed circuit board |
| PTR1, PTR2: display transistors | |
| GTR1 and GTR2: peripheral transistor | |

What is claimed is:

1. A display device comprising:
a display area comprising a plurality of pixels;
a first peripheral area at one side of the display area; and
a second peripheral area at the other side of the display area spaced apart from the one side in a first direction,
wherein first column spacers are in the display area in a first pattern, second column spacers are in the first peripheral area in a second pattern, and third column spacers are in the second peripheral area in a third pattern;
wherein in corresponding areas respectively located at the same point in the first peripheral area and the second peripheral area, the second pattern and the third pattern are different from each other; and
wherein, when the first peripheral area and the second peripheral area overlap in a plan view, a planar sum of the second pattern and the third pattern where the first and second peripheral areas overlap is the same as the first pattern in the display area with respect to a same unit area.

2. The display device of claim 1, wherein:
the first peripheral area comprises:
a first driving area adjacent to the display area and comprising a first gate driver, and
a first sealing area adjacent to the first driving area and comprising a first portion of a sealant;
the second peripheral area comprises:
a second driving area adjacent to the display area and comprising a second gate driver, and
a second sealing area adjacent to the second driving area and comprising second portion of the sealant; and
the second column spacers are in the first driving area, and the third column spacers are in the second driving area.

3. The display device of claim 2, wherein:
when the first peripheral area and the second peripheral area overlap in a plan view, the second column spacers and the third column spacers are spaced apart from each other.

4. The display device of claim 3, wherein:
the first peripheral area comprises a plurality of first peripheral transistors;
the second peripheral area comprises a plurality of second peripheral transistors; and
when the first peripheral area and the second peripheral area overlap in the plan view, at least some of the first and second peripheral transistors overlap each other.

5. The display device of claim 3, wherein the number of second column spacers in the first driving area is half of the number of the first column spacers in the display area with respect to the same unit area.

6. The display device of claim 5, wherein the number of the third column spacers in the second driving area is half of the number of the first column spacers in the display area with respect to the same unit area.

7. The display device of claim 6, wherein:
the first driving area and the second driving area have the same area; and
a sum of a total density of the second column spacers in the first driving area and a total density of the third column spacers in the second driving area is the same as a total density of the first column spacers in the display area with respect to the same unit area.

8. The display device of claim 2, wherein:
the first driving area comprises a plurality of left driving unit areas;
the second driving area comprises a plurality of right driving unit areas;
the display area comprises a plurality of general display unit areas;
each of the left driving unit areas, the right driving unit areas, and the general display unit areas have the same planar area;
the left driving unit areas comprise a first left driving unit area;
the right driving unit areas comprise a first right driving unit area; and the second column spacers and the third column spacers are spaced apart from each other when the first left driving unit area and the first right driving unit area overlap each other.

9. The display device of claim 8, wherein one general display unit area overlaps two or more of the plurality of pixels.

10. The display device of claim 2, wherein:
a first control signal line that is to apply a first control signal to the first gate driver is in the first sealing area;
the first portion of the sealant in the first sealing area and the first control signal line overlap each other;
a second control signal line that is to apply a second control signal to the second gate driver is in the second sealing area; and
the second portion of the sealant in the second sealing area and the second control signal line overlap each other.

* * * * *